(12) United States Patent
DeBrosse et al.

(10) Patent No.: US 9,373,783 B1
(45) Date of Patent: Jun. 21, 2016

(54) SPIN TORQUE TRANSFER MRAM DEVICE FORMED ON SILICON STUD GROWN BY SELECTIVE EPITAXY

(71) Applicant: International Business Machines Corporation, Armonk, NY (US)

(72) Inventors: John K. DeBrosse, Colchester, VT (US); Janusz J. Nowak, Highland Mills, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/627,265

(22) Filed: Feb. 20, 2015

(51) Int. Cl.
*H01L 27/22* (2006.01)
*H01L 43/12* (2006.01)
*H01L 43/08* (2006.01)

(52) U.S. Cl.
CPC .............. *H01L 43/12* (2013.01); *H01L 27/228* (2013.01); *H01L 43/08* (2013.01)

(58) Field of Classification Search
CPC .. H01L 21/02518; H01L 21/702; H01L 43/00
See application file for complete search history.

(56) References Cited

U.S. PATENT DOCUMENTS

| | | | |
|---|---|---|---|
| 6,713,378 B2 | 3/2004 | Drynan | |
| 7,313,013 B2 | 12/2007 | Sun et al. | |
| 7,629,637 B2 | 12/2009 | Kajiyama et al. | |
| 7,697,313 B2 | 4/2010 | Klostermann | |
| 8,300,454 B2 | 10/2012 | Kramer et al. | |
| 8,828,743 B1 | 9/2014 | DeBrosse et al. | |
| 8,835,256 B1 | 9/2014 | DeBrosse et al. | |
| 2012/0241826 A1 | 9/2012 | Satoh et al. | |
| 2012/0248529 A1 | 10/2012 | Liu et al. | |
| 2012/0326250 A1 | 12/2012 | Gaidis et al. | |
| 2013/0043530 A1* | 2/2013 | Kim ..................... H01L 27/105 257/334 |
| 2014/0264512 A1 | 9/2014 | DeBrosse et al. | |

OTHER PUBLICATIONS

DeBrosse, J.K., et al., "Structure and Fabrication of Memory Array with Epitaxially Grown Memory Elements and Line-Space Patterns," U.S. Appl. No. 13/835,868, filed Mar. 15, 2013.
G. Hu, et al., "In-Situ Annealing to Improve to Tunnelling Magneto-Resistance of Magnetic Tunnel Junctions," U.S. Appl. No. 14/585,435, filed Dec. 30, 2014.
List of IBM Patents or Patent Applications Treated as Related; Apr. 14, 2015; pp. 1-2.
DeBrosse, J.K., et al., "Memory Array with Self-Aligned Epitaxially Grown Memory Elements and Annular FET," U.S. Appl. No. 13/843,998, filed Mar. 15, 2013.
List of IBM Patents or Patent Applications Treated as Related; Feb. 20, 2015; pp. 1-2.
List of IBM Patents or Patent Applications Treated as Related; Mar. 11, 2015; pp. 1-2.

* cited by examiner

*Primary Examiner* — Cheung Lee
(74) *Attorney, Agent, or Firm* — Cantor Colburn LLP; Vazken Alexanian

(57) ABSTRACT

A technique relates magnetoresistive random access memory (MRAM). A dielectric layer is disposed on a transistor, and the transistor is formed in a uniform crystalline substrate. A hole is formed through the dielectric layer to reach the transistor. A polycrystalline material is disposed in the hole by using selective epitaxial growth (SEG), and the polycrystalline material is annealed to create an epitaxial stud. A magnetic tunnel junction (MTJ) is disposed on the epitaxial stud (SEG).

11 Claims, 18 Drawing Sheets

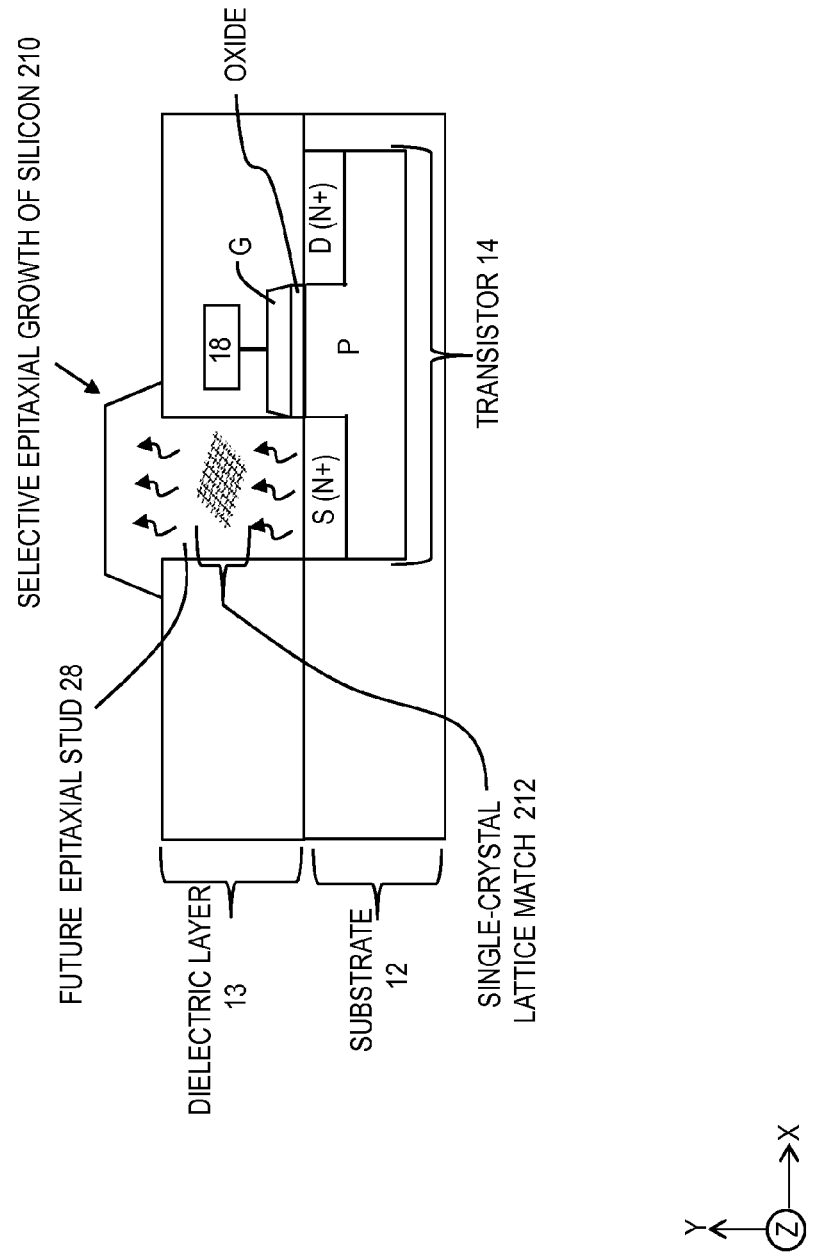

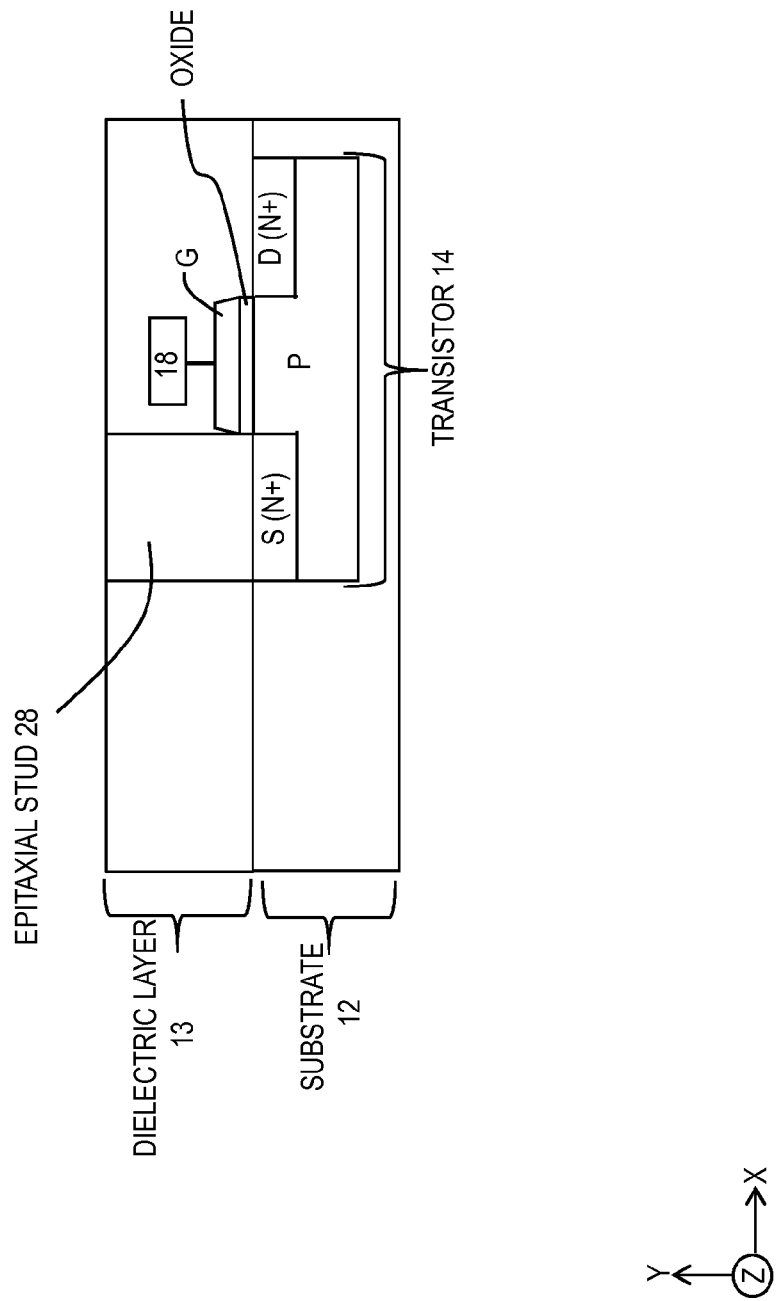

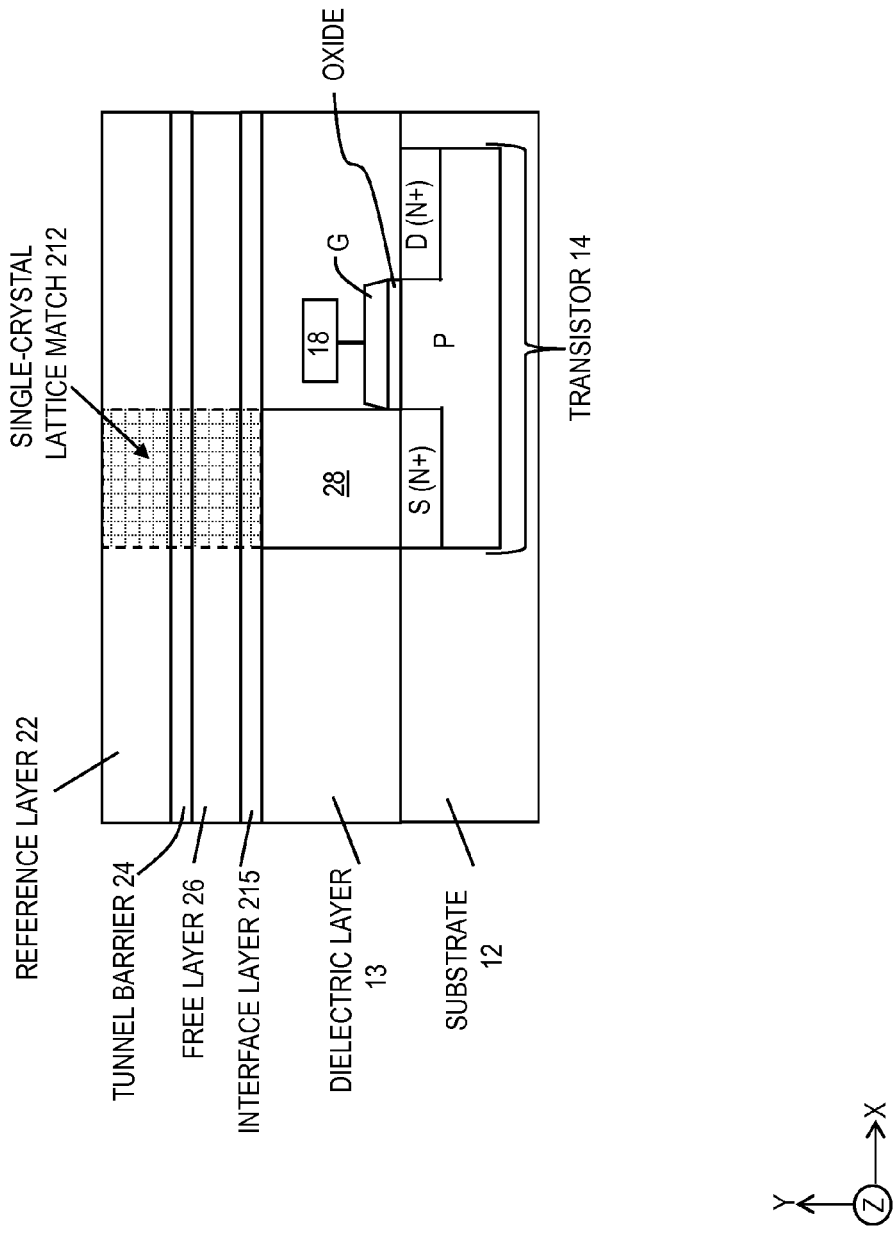

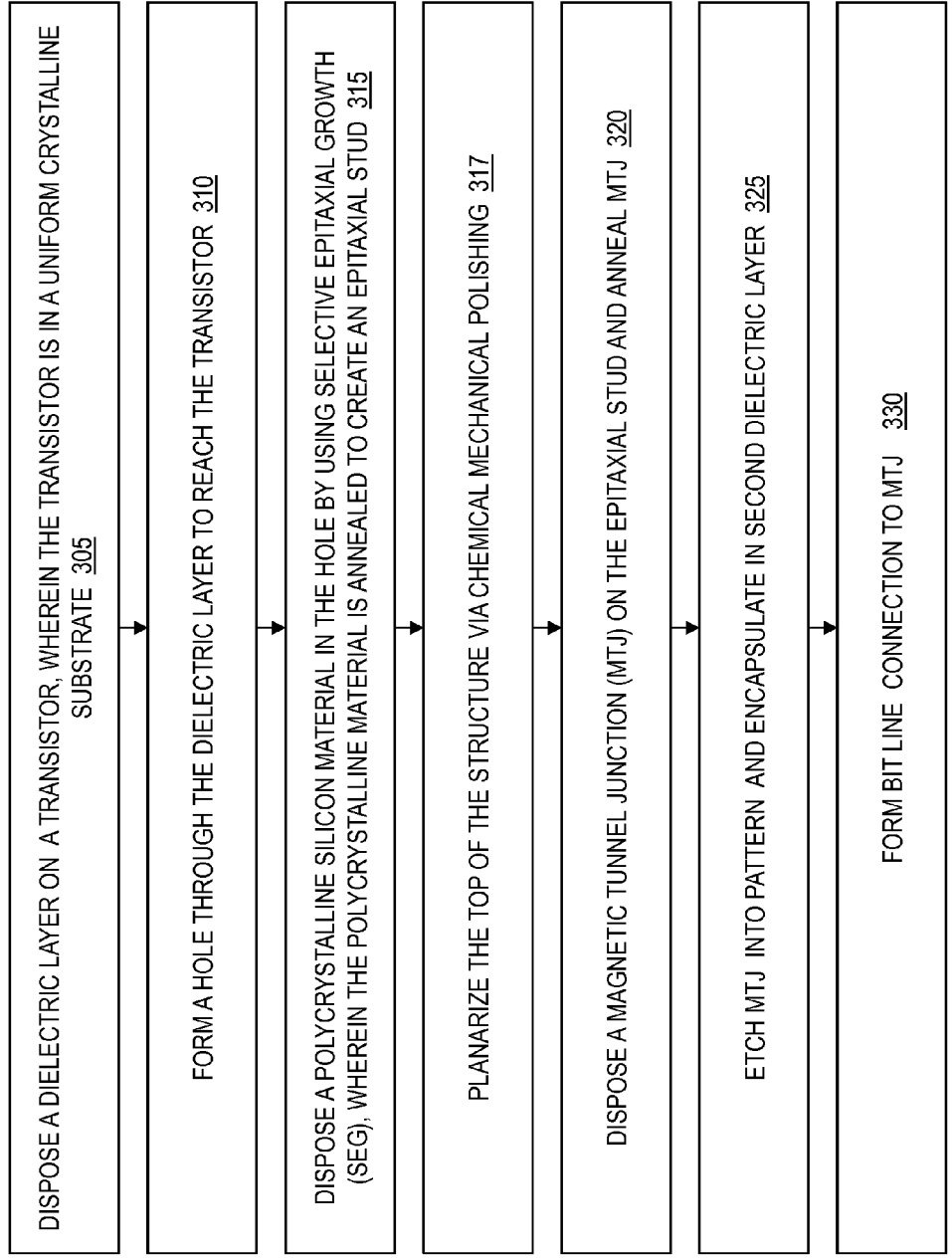

SPIN TORQUE TRANSFER MRAM DEVICE FORMED ON SILICON STUD GROWN BY SELECTIVE EPITAXY

BACKGROUND

The present invention relates to magnetoresistive random access memory (MRAM), and more specifically, to forming an MRAM device on top of a silicon stud grown by selective epitaxial growth (SEG).

A spin torque magnetic random access memory (MRAM) device uses a two terminal spin-torque based memory element. The two terminal spin-torque based memory element includes a pinned layer, a tunnel barrier layer, and a free layer in a magnetic tunnel junction (MTJ) stack. The pinned layer is also called the reference layer. The magnetization of the pinned layer is fixed in a direction such that when current passes through the MTJ stack the free layer becomes either parallel or anti-parallel to the pinned layer. Resistance of the device depends on the relative orientation of the free layer and the pinned layer.

SUMMARY

According to one embodiment, a method of forming a magnetoresistive random access memory (MRAM) device is provided. A dielectric layer is disposed on a transistor, where the transistor is formed in a uniform crystalline substrate. A hole is formed through the dielectric layer to reach the transistor. A polycrystalline material is disposed in the hole by using selective epitaxial growth (SEG), where the polycrystalline material is annealed to create an epitaxial stud. A magnetic tunnel junction (MTJ) is disposed on the epitaxial stud (SEG).

According to one embodiment, a method of forming a magnetoresistive random access memory (MRAM) device is provided. A dielectric layer is disposed on a transistor, where the transistor is formed in a uniform crystalline substrate. A hole is formed through the dielectric layer to reach the transistor. A polycrystalline material is disposed in the hole by using selective epitaxial growth (SEG), where the polycrystalline material is annealed to create an epitaxial stud. A magnetic tunnel junction (MTJ) is disposed on the epitaxial stud, where the magnetic tunnel junction is unpatterned. A bit line is disposed on the magnetic tunnel junction. A free magnetic layer of the magnetic tunnel junction is defined according to a width of the epitaxial stud.

According to one embodiment, a method of forming a magnetoresistive random access memory (MRAM) device is provided. A transistor vertically positioned on a uniform crystalline substrate is formed, where the transistor has a terminal and another terminal. A dielectric layer is disposed around the transistor. A magnetic tunnel junction is disposed on the terminal of the transistor, where the magnetic tunnel junction is unpatterned. A bit line is disposed on the magnetic tunnel junction. A free magnetic layer of the magnetic tunnel junction is defined according to a width of the terminal of the transistor.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A through 2G illustrate forming a magnetic random access memory (MRAM) device built on a selective epitaxial growth (SEG) silicon stud according to an embodiment, in which:

FIG. 2A illustrates disposing a dielectric layer and forming a hole in the dielectric to contact source or drain of individual transistors;

FIG. 2B illustrates selective epitaxial growth (SEG) in the hole;

FIG. 2C illustrates performing chemical mechanical polishing to planarize the epitaxial stud formed by the selective epitaxial growth;

FIG. 2D illustrates disposing magnetic tunnel junction (MTJ) layers on top the planarized SEG stud in order to have a lattice match with the epitaxial stud;

FIG. 2E illustrates disposing a conductive hard mask layer;

FIG. 2F illustrates patterning the magnetic tunnel junction; and

FIG. 2G illustrates encapsulating the structure and disposing a bit line on top;

FIG. 3 illustrates a method of forming a magnetic random access memory (MRAM) device according to an embodiment;

FIGS. 4A through 4C illustrate forming a magnetic random access memory (MRAM) device with a SEG silicon stud defining the free layer according to a second embodiment, in which:

FIG. 4A starts from FIG. 2D and adds a bit line;

FIG. 4B illustrates annealing to convert portions of the free magnetic layer above the dielectric into an insulator while portions above the silicon stud are not converted and to define the active area of the MTJ;

FIG. 4C illustrates that the active region of the magnetic tunnel junction is defined by the unconverted free magnetic layer;

DETAILED DESCRIPTION

Spin torque transfer (STT) magnetoresistive random access memory (MRAM) is an attractive emerging memory technology, offering non-volatility, high performance, and high endurance. The STT MRAM memory cell typically consists of a magnetic tunnel junction (MTJ) in series with a select device, typically a transistor such as a field effect transistor (FET). The MTJ is typically formed by deposition, lithographic patterning, and subtractive etching. The MTJ typically resides in between two subsequent metal levels in the Back End of Line (BEOL) metallization layers.

Embodiments provides deposition of the MTJ layers in a heteroepitaxial manner using an underlying single-crystal seed to improve the uniformity and orientation of MTJ films and hence improve uniformity of all the electrical and magnetic properties of the MTJ.

The state-of-the-art may have memory cell structures in which polycrystalline MTJ layers are deposited directly on metallic vias (usually polycrystalline). As a result crystalline grains in individual MTJs follow almost random crystalline structure of underneath metallic layers and every MTJ have different crystal orientation and properties.

For this and other reasons, a method for building heteroepitaxial MTJs subsequent to the completion of the FET processing is attractive (as disclosed in embodiments), but none are currently provided in the state-of-the-art. Prior to deposition of the contact area (CA) level dielectric, the surface is not sufficiently planar, and thereafter no single-crystal seed layer is available in the state-of-the-art.

However, embodiments are provided herein for a STT MRAM device built upon a single-crystal selective epitaxial growth silicon stud.

Under appropriate deposition conditions, known as selective epitaxial growth (SEG), epitaxial silicon grows upon exposed silicon areas but not upon other materials. For example, the epitaxial silicon grows upon exposed silicon areas but not exposed dielectric surfaces.

Figure 1:
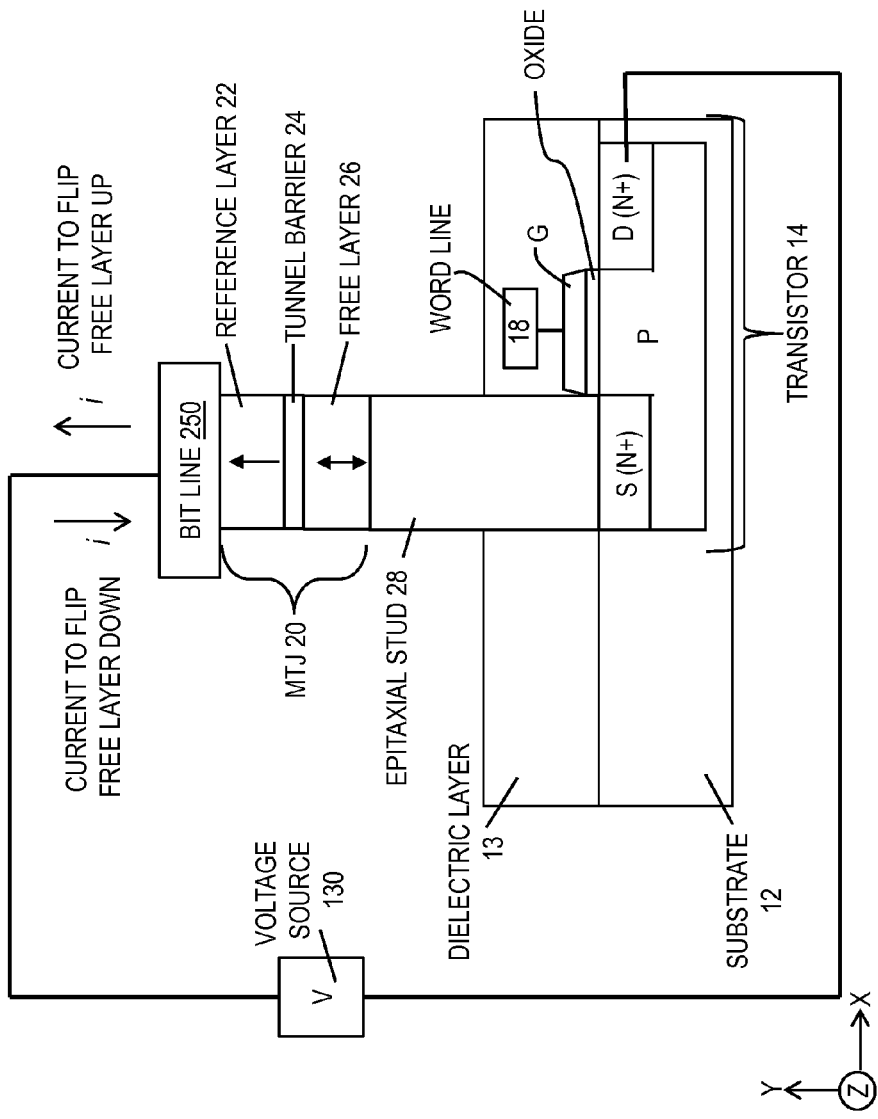
FIG. 1 illustrates a magnetic random access memory (MRAM) device located directly on silicon selective epitaxial growth (SEG) according to an embodiment.

FIG. 1 illustrates a conceptual view of a spin torque transfer (STT) magnetoresistive random access memory (MRAM) device 100 built on a single-crystal epitaxial growth (SEG) silicon stud according to an embodiment. FIG. 1 shows an epitaxial STT magnetic tunnel junction (MTJ) 20 which includes a reference magnetic layer 22 (also referred to as a pinned layer, fixed layer, etc.), a tunnel barrier layer 24, and a free magnetic layer 26. A bit line 250 is on top of the STT MTJ 20. A conductive hard mask layer may be disposed between the bit line 250 and the STT MTJ 20.

The MTJ 20 is formed on a single-crystal epitaxial growth silicon stud 28 (also referred to as a selective epitaxial growth (SEG) stud or epitaxial stud 28). The SEG epitaxial 28 is formed on a substrate 12, such as a uniform silicon crystal substrate. The substrate 12 may be a silicon wafer.

A select transistor 14 is may be formed in/on the substrate 12, and the transistor 14 has a source terminal (S), a gate terminal (G), and a drain terminal (D). The epitaxial stud 28 is formed on top of the source terminal of the transistor 14. A thin dielectric such as an oxide may be under the gate terminal. The gate terminal of the transistor 14 may be connected to a word line 18.

A dielectric layer 13 may be formed over the substrate 12, wherein the dielectric layer 13 acts a spacer.

The MTJ 20 has a magnetic anisotropy perpendicular to the layers of the MTJ 20. This means that the magnetic moments of the reference magnetic layer 22 and the free magnetic layer 26 are out-of-plane. The magnetic moment of the reference magnetic layer 22 is shown by an upward pointing arrow, and the magnetic moment of the reference magnetic layer 22 is fixed. The magnetic moment of the free magnetic layer 26 is shown with a double arrow pointing both up and down. The magnetic moment of the free magnetic layer 26 can be flipped either up or down based on applying a write current. For example, when a write current flows down (e.g., down through bit line 250, through the MTJ 20, through the epitaxial stud 28, and into the substrate 12 (e.g., the source terminal of the transistor 14), the magnetic moment of the free magnetic layer 26 is flipped to point down. In this case, the downward pointing magnetic moment of the free magnetic layer 26 is antiparallel to the upward pointing magnetic moment of the reference magnetic layer 22. This antiparallel relationship has a high resistance which is typically read as a "0".

However, when a write current flows up (e.g., up from the substrate 12, through the epitaxial stud 28, through the MTJ 20, and up through bit line 250), the magnetic moment of the free magnetic layer 26 is flipped to point up. In this case, the upward pointing magnetic moment of the free magnetic layer 26 is parallel to the upward pointing magnetic moment of the reference magnetic layer 22. This parallel relationship has a low resistance which is typically read as a "1".

FIGS. 2A through 2G illustrate a sequence of cross-sectional views of a method of forming the spin torque transfer (STT) magnetoresistive random access memory (MRAM) device 100 on the single crystal substrate 12 after forming the transistor 14 according to an embodiment. While FIGS. 2A through 2H illustrate processing for forming a single MRAM device 100, it will be understood that tens, hundreds, etc., of MRAM devices 100 may be simultaneously formed in the same manner discussed herein. It should also be noted that FIGS. 2A-2H are not drawn to scale, and illustrate how to form heteroepitaxial layers for the MTJ 20, where each layer 22, 24, 26 of the MTJ 20 has a lattice constant matching the lattice constant of the single crystal substrate 12 below.

Figure 2A:
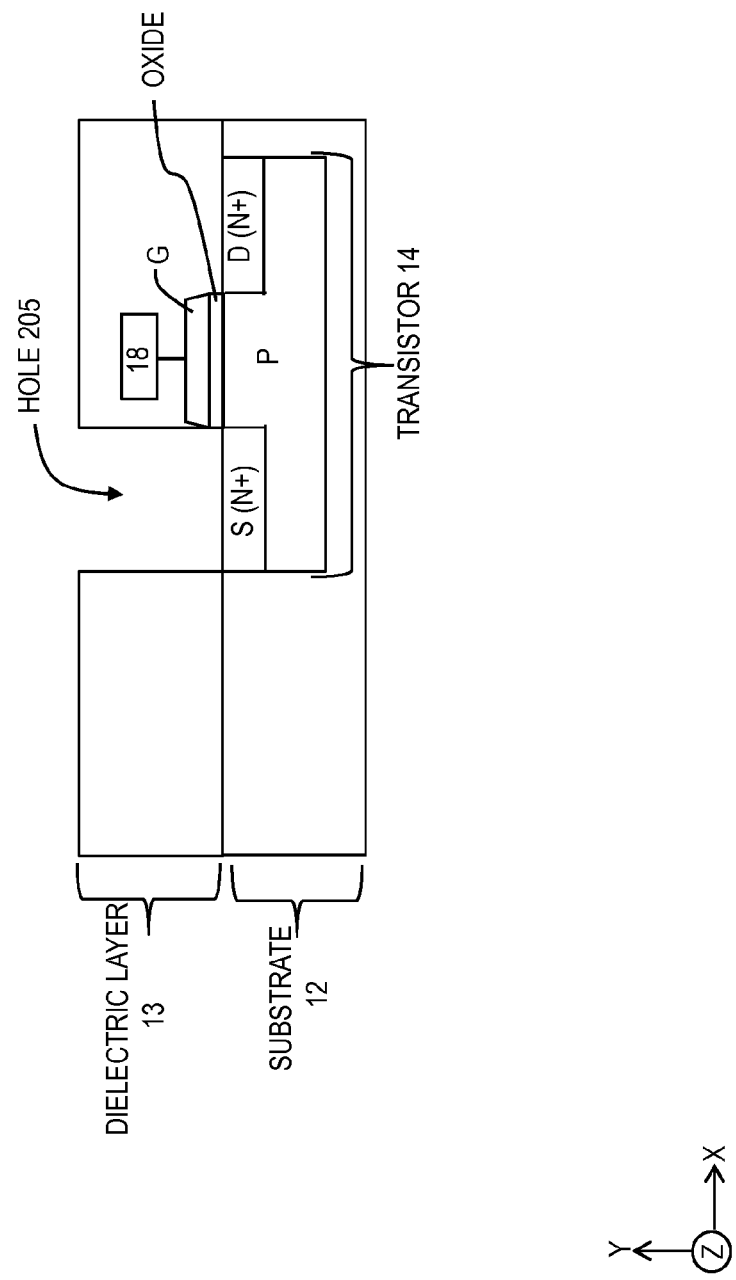

FIG. 2A shows the substrate 12, which may be a silicon wafer in one case. Single-crystal means that the substrate 12 is not a polycrystalline substrate. The substrate 12 includes the transistor 14. The transistor 14 has been previously formed in the substrate 12 via conventional techniques understood by one skilled in the art. A dielectric layer 13 is deposited on the top surface of the substrate 12. The dielectric layer 13 covers the surface of the substrate 12 including the transistor 14. The dielectric layer 13 may include silicon dioxide, germanium dioxide, and hafnium oxide. FIG. 2A illustrates that a hole 205 (contact via) is formed through the dielectric layer 13 down to the transistor 14 underneath. For example, a contact-like hole is patterned and etched, exposing the source/drain terminal of the select transistor 14 (FET). The hole 205 is formed directly over the source (S) terminal of the transistor 14. In another case, the hole 205 may be formed directly over the drain (D) instead of the source (S) of the transistor 14. The hole 205 has a depth corresponding to the thickness of the dielectric layer 13.

FIG. 2B shows that selective epitaxial growth (SEG) is performed in order to fill and/or slightly overfill the hole 205 with single-crystal silicon 210 using the substrate wafer 12 as the seed. In FIG. 2B, the single-crystal silicon 210 has a lattice match (e.g., matching lattice constant) to the single-crystal substrate 12 used as the seed. SEG means that the silicon material is growing epitaxially in selected places on the wafers (i.e., in the holes 205) on the top of wafer surface where source (or drain) of transistor 14 are located. Annealing is performed to ensure that the silicon 210 has a single-crystal lattice structure that matches single-crystal substrate 12. In one case, the silicon 210 may be polycrystalline and the annealing orients lattice of the silicon 210 to match the single-crystal lattice (e.g., lattice constant) of the single-crystal substrate 12.

Note that transfer/orientation of the single-crystal lattice match 212 (from the single-crystal substrate 12 to the single-crystal silicon 210 via selective epitaxial growth (SEG)) is represented schematically by the grid in FIG. 2B.

Also, it will be noted that transistor 14 (FET) could be a conventional, vertical, and/or other variety of FET. To minimize parasitic resistance, the epitaxial stud 28 may be heavily N-type (N+) doped, assuming the epitaxial stud 28 is grown over the N-type part of transistor 14 in the substrate 12. The doping could be introduced in-situ during the SEG formation step and/or thereafter by implantation.

FIG. 2C shows that the structure is then planarized (flattened) using, e.g., chemical mechanical polishing/planarization (CMP), which is a process of smoothing surfaces with the combination of chemical and mechanical forces. Accordingly, the SEG epitaxial stud 28 is formed and/or remains after CMP. In one case, the width (which may be a diameter) of the epitaxial stud 28 is about 22-28 nm in the x-direction. The width of the epitaxial stud 28 is measured in the x-axis and can refer to a diameter in the x-axis. In another case, the width of the epitaxial stud 28 may be about 10 nm. The width of the epitaxial stud 28 may correspond to the width that can be produced with current standard semiconductor device fabrication technology.

FIG. 2D illustrates depositing the layers of the magnetic tunnel junction 20. The MTJ layers are deposited in a heteroepitaxially using the top of the SEG silicon epitaxial stud 28 as the seed. By having an atomically smooth SEG surface (via the CMP process), the MTJ stack 20 can be grown heteroepitaxially on top. By using an appropriate interface layer which lattice matches the MTJ's layers 20 and the Si SEG 28, embodiments can continue growing heteroepitaxially all MTJ's layers 20. First, an interface layer or layers 215 may be deposited, to accomplish one or more of the following: to act as a diffusion barrier, to create an ohmic contact, to enable lattice matching (between the SEG stud 28 and the layers above the interface layer 215), to promote perpendicular magnetic anisotropy, and/or to control stress. The thickness (in the y-axis) of the interface layer 215 may be from 0.2-5 nm. In one case, the thickness of the interface layer 215 may include multiple layers, each 1 nm or below, in order to total 5 nm. The interface layer 215 may be iron silicide, nickel, or cobalt silicide, and/or its alloys. The interface layer 215 has the same single-crystal lattice orientation 212 as the SEG epitaxial stud 28 underneath, thus having the single-crystal lattice orientation 212 to the single-crystal substrate 12.

It may be difficult to match directly Co, Fe, and Ni silicide's to magnetic layers used in MTJ like Fe, CoFe alloys, and usually mismatch is of the order of few percent and more. The interface layer 215 may include an ultrathin buffer layer (e.g., few angstroms thick) made from other metals (such as Ta, Ru, Hf, Nb, Mo, Pt, Ir, W), and the ultrathin buffer layer can be used to divide this mismatch into two smaller mismatches at both surfaces of this interface layer 215. For example, if the total mismatch is 6%, one implementation can use a metal which will give 2% mismatch on bottom of this metal and 4% mismatch on the top of this layer.

Next, the free magnetic layer 26 is deposited on the interface layer 215. The tunnel barrier layer 24 is deposited on the free magnetic layer 26. The reference magnetic layer 22 is deposited on the tunnel barrier layer 24. All these layers (layers, 22, 24, 26, 215) are to be heteroepitaxially grown on the SEG 28. As a result, all memory cells have the same crystal orientation. Although one memory cell is illustrated, it is understood that the process applies to an array of memory cells.

Figure 2E:
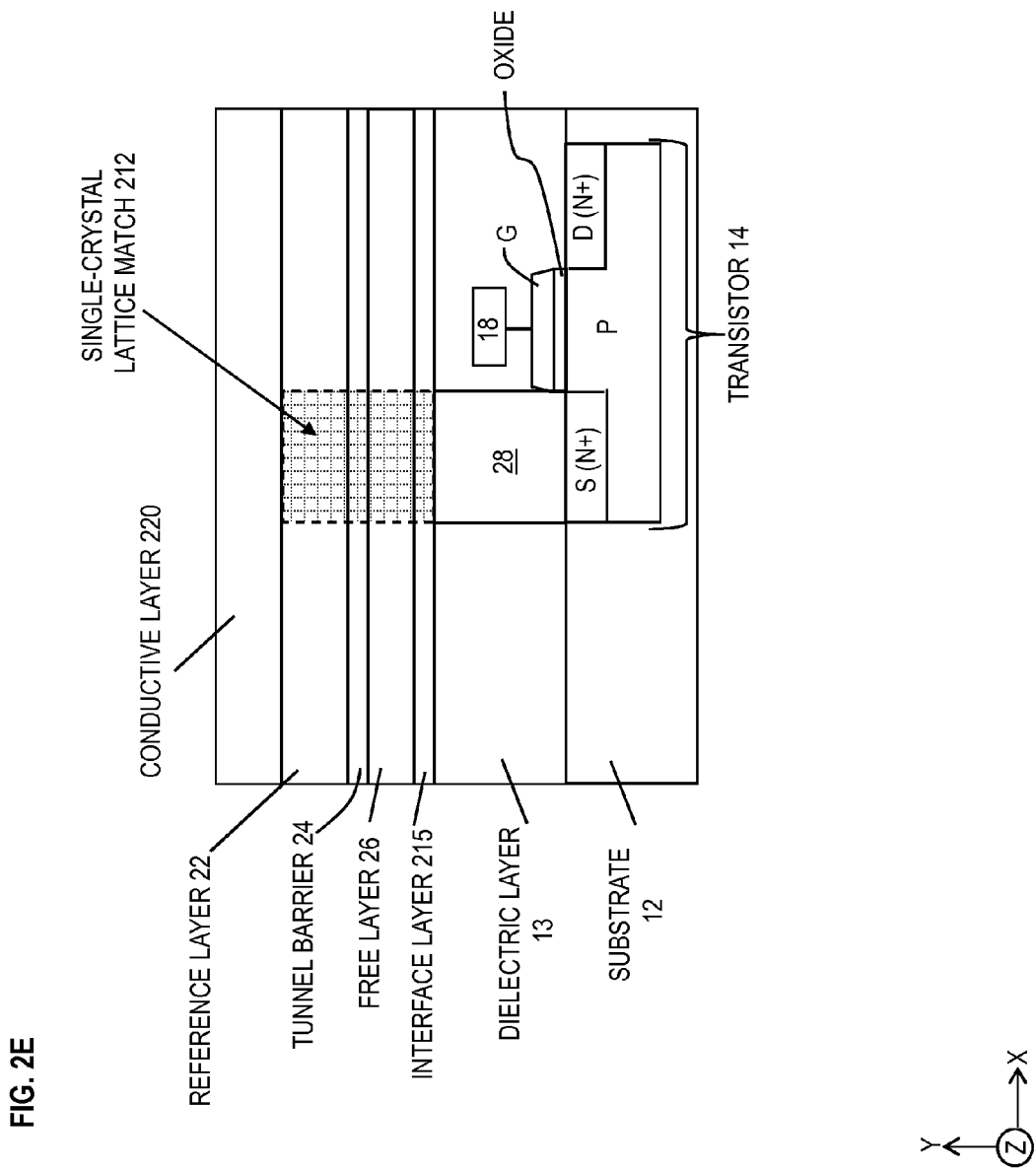

FIG. 2E shows that a conductive hard mask layer 220 is disposed on the reference magnetic layer 22. Other than the conductive hard mask layer 220, this film stack (of layers 215, 26, 24, 22) is of a single-crystal nature above the silicon epitaxial stud 28, and not so elsewhere, with a boundary near the edge of the stud 28. The single-crystal nature in the layer 215, 26, 24, 22 is represented by the single-crystal lattice match 212.

The free magnetic layer 26 and reference magnetic layer 22 may be materials comprising at least one of iron, cobalt, nickel, such as cobalt iron (CoFe), cobalt nickel (CoNi), iron boron (FeB), cobalt iron boron (CoFeB), nickel iron (NiFe), etc. The tunnel barrier layer 24 may be a thin insulator or semiconductor material, such as magnesium oxide (MgO), aluminum oxide (AlO), hafnium oxide (HfO), etc.

Figure 2F:
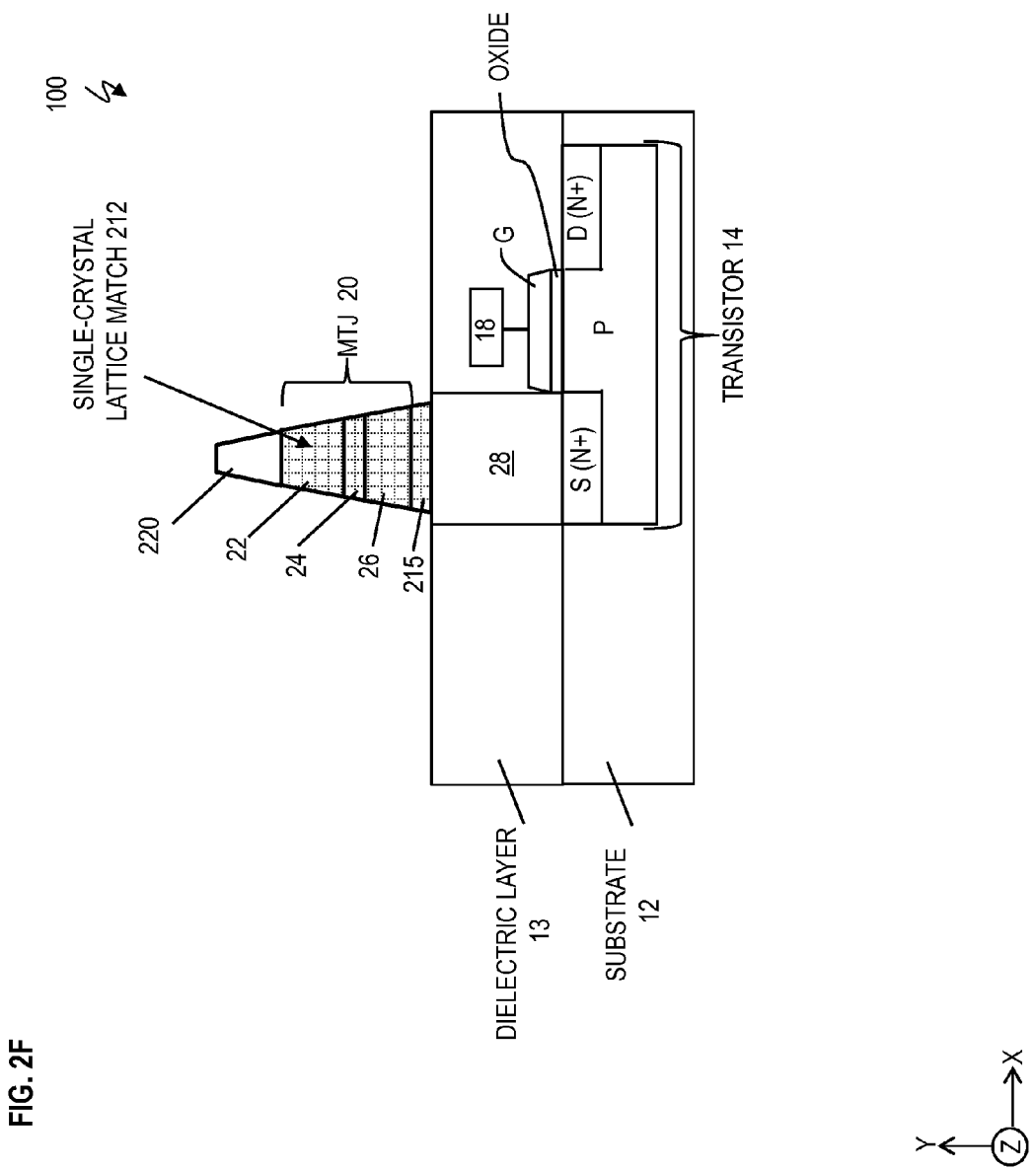

As shown in FIG. 2F, the MRAM device 100 including the MTJ 20 is patterned and subtractively etched using conventional techniques. The SEG silicon stud 28 should be designed larger than the MTJ 20 such that the MTJ 20 (along with interface layer 215) lies entirely within the single-crystal region of the stud 28. In other words, width/diameter (in the x-axis) of the MTJ 20 (along with interface layer 215) is smaller than the width/diameter of the epitaxial stud 28. In another implementation, the width/diameter of the MTJ 20 (along with interface layer 215) matches the width/diameter of the epitaxial stud 28. In another implementation, the MTJ 20 can be slightly larger than SEG 28, which avoids edges of the MTJ 20 being damaged by the etch process.

Figure 2G:
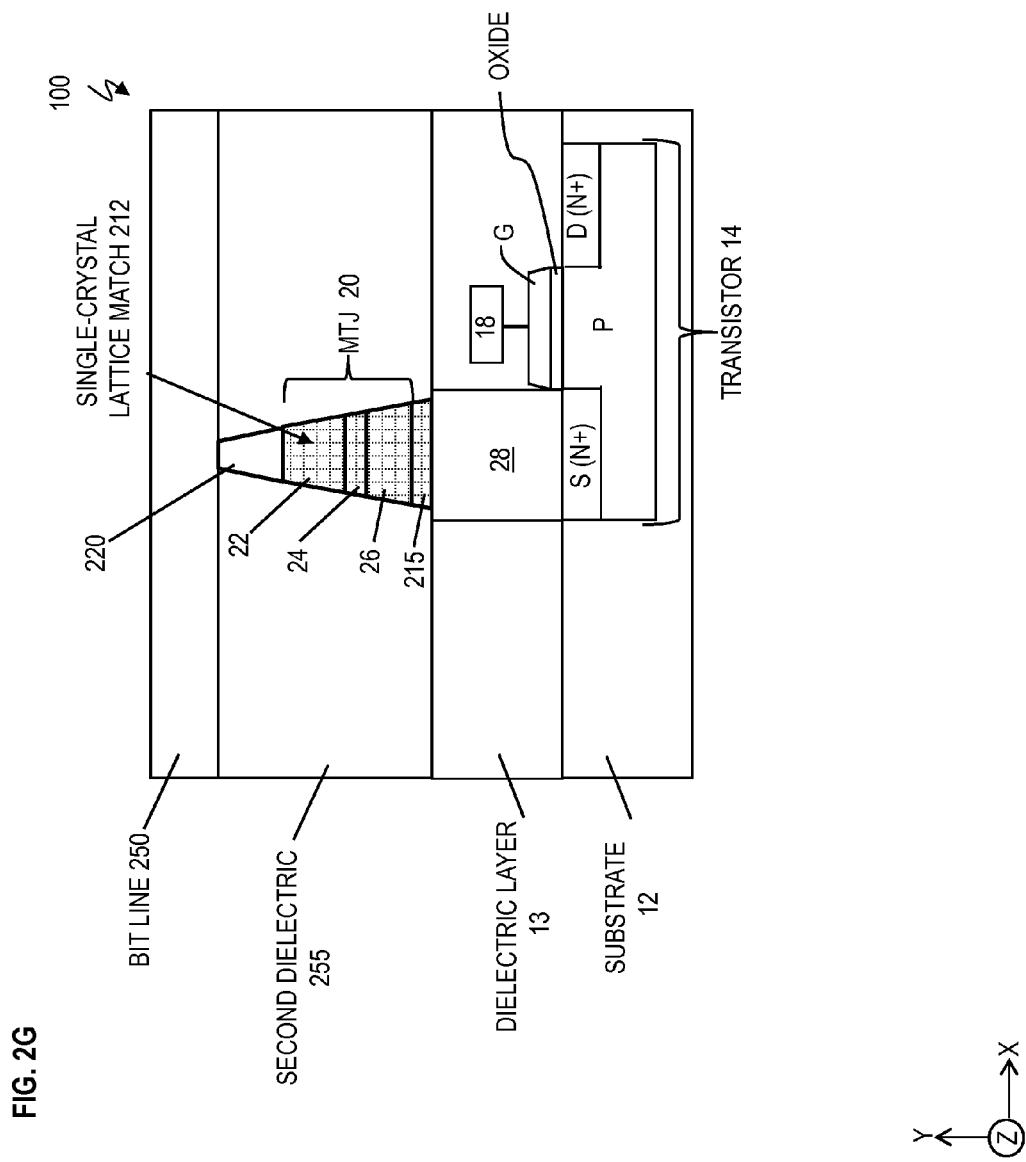

FIG. 2G illustrates encapsulating the MTJ 20, along with layer 215 and 220 in a second dielectric layer 255. The bit line 250 is deposited on of the second dielectric layer 255, such that electrical contact is made between the bit line 250 and the conductor hard mask layer 220. Subsequent processing, such as the electrical connection to the bit line 220, is performed as understood by one skilled in the art.

Although the layers 215, 26, 24, 22, and 220 of the MRAM device 100 are shown as narrowing from bottom to top in FIG. 2G, in another implementation the width/diameter of the layers 215, 26, 24, 22, and 220 remains the same from bottom to top.

In one implementation, the order of the free magnetic layer 26 and reference magnetic layer 22 may be reversed such that the free magnetic layer 26 is on top in FIG. 2 (but not in FIGS. 4-9). Also, other MTJ patterning methods besides the conductive hard mask method could be used.

Also, the single-crystal nature of the MTJ film stack could be terminated earlier, such as after the tunnel barrier layer 24 for example. In this case, only the interface layer 215, free magnetic layer 26, and tunnel barrier layer 24 would have the single-crystal lattice match 212, while the reference magnetic layer 22 does not.

FIG. 3 is a method 300 of forming the magnetoresistive random access memory (MRAM) device 100 according to an embodiment. Reference can be made to FIGS. 1 and 2.

At block 305, the dielectric layer 13 is disposed on the transistor 14, where the transistor 14 is in a uniform crystalline substrate 12. At block 310, a hole 205 is formed through the dielectric layer 13 to reach the transistor 14.

At block 315, a polycrystalline material (usually Si, or SiGe alloys) is disposed in the hole 205 by using selective epitaxial growth (SEG), wherein the polycrystalline material is annealed to create an epitaxial stud 28. The top surface of the structure is planarized via CMP at block 317.

At block 320, the magnetic tunnel junction (MTJ) 20 is disposed on the planarized epitaxial stud 28 and the MTJ 20 is annealed. Etching occurs to pattern the MTJ 20 and the patterned MTJ 20 is encapsulated in the second dielectric layer 255 at block 325. At block 330, the bit line 250 is formed on the top surface and connected to the MTJ 20.

The transistor 14 comprises a source and a drain. The hole 205 is optionally formed over the source and/or the drain of the transistor 14.

The epitaxial stud 28 is disposed over the source or the drain of the transistor 14. The magnetic tunnel junction 20 is disposed over the source or the drain of the transistor 14. The magnetic tunnel junction 20 comprises a tunnel barrier layer 24 sandwiched between a free magnetic layer 26 and a reference magnetic layer 22. An interface layer 215 is disposed between the magnetic tunnel junction 20 and the epitaxial stud 28.

The epitaxial stud 28 is doped with dopants such that electrical current is allowed to flow between the transistor 14 and the magnetic tunnel junction 20. When the epitaxial stud 28 is formed on top of the source (or drain) that is N-type, the epitaxial stud 28 is correspondingly N-type. Likewise, when the epitaxial stud 28 is formed on top of the source (or drain) that is P-type, the epitaxial stud 28 is correspondingly P-type.

Annealing the polycrystalline material to become the epitaxial stud 28 forms a lattice match to the (below) uniform crystalline substrate 12. The magnetic tunnel junction 20 is grown to have the lattice match (or a small mismatch) to both the epitaxial stud 28 and the uniform crystalline substrate 12.

Figure 4A:
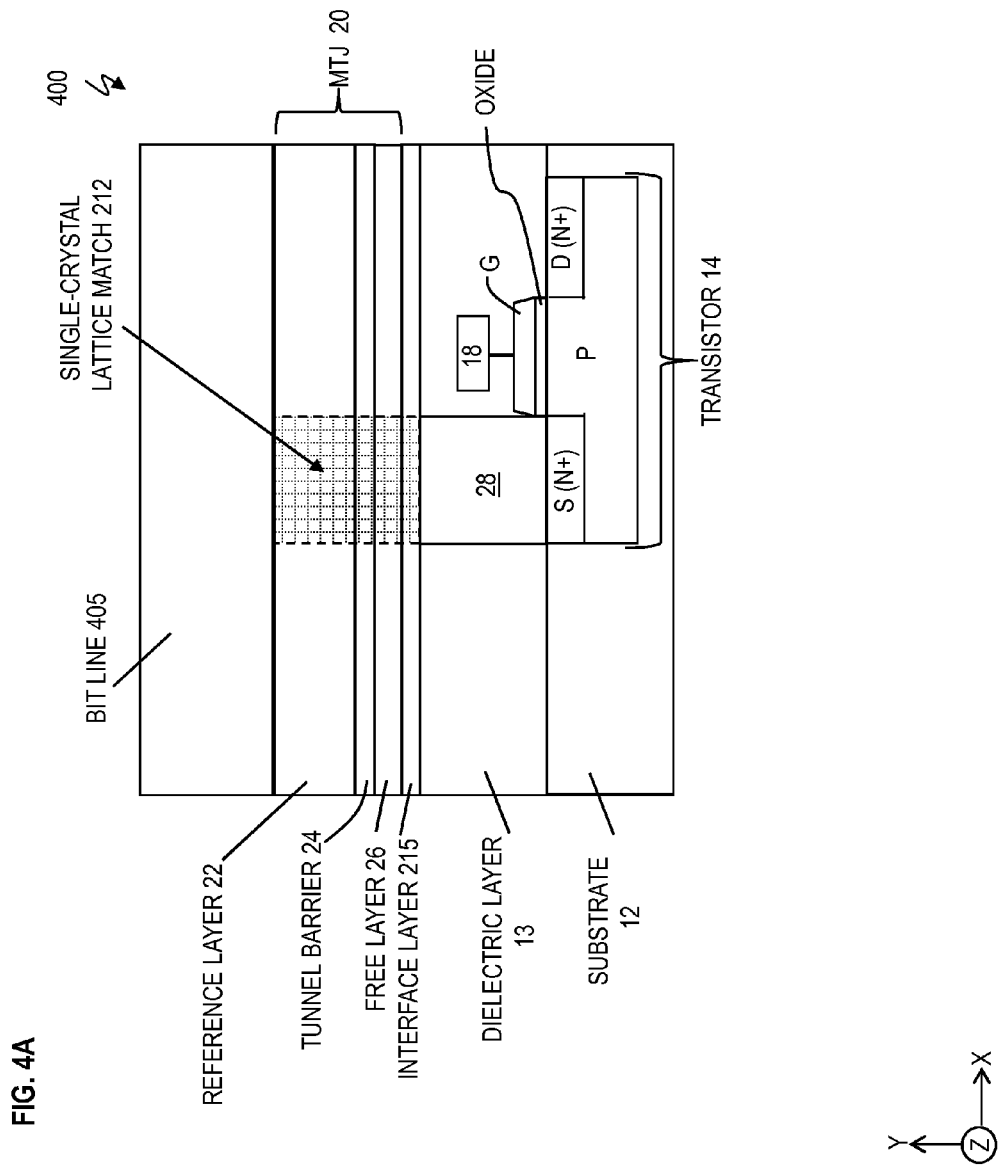
Figure 4B:
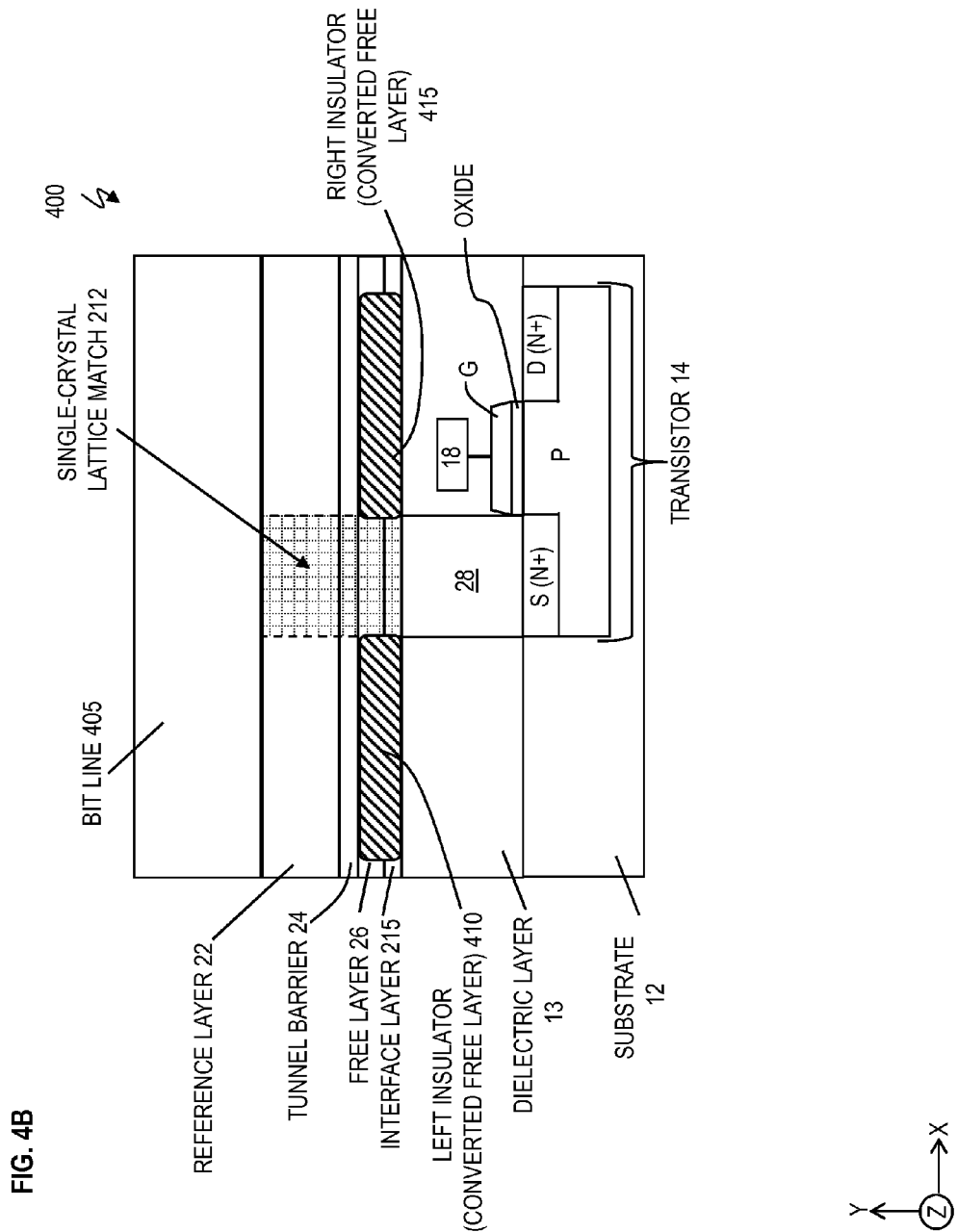
Figure 4C:
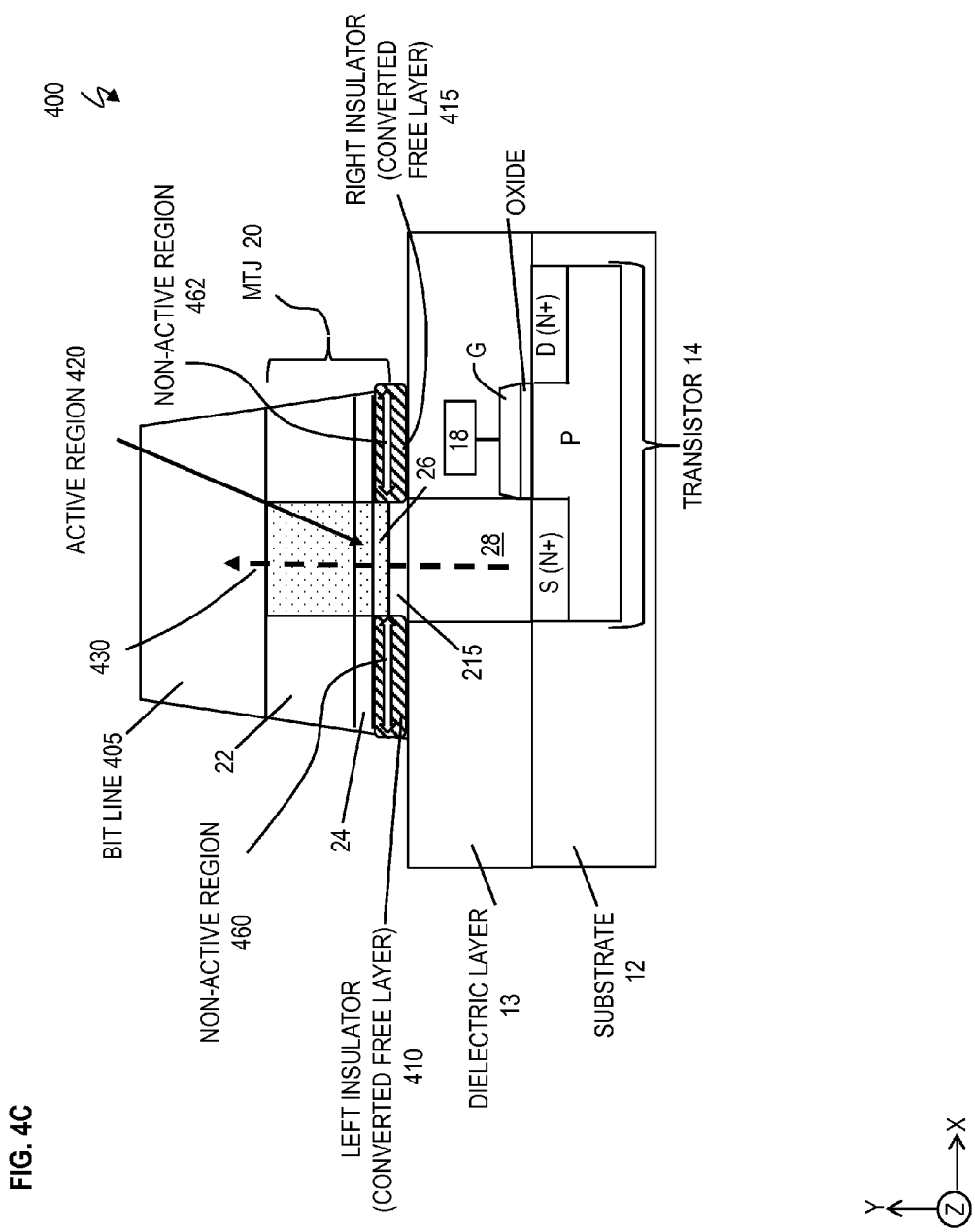

FIGS. 4A through 4C illustrate cross-sectional views of forming the spin torque transfer (STT) magnetoresistive random access memory (MRAM) device 200 on the single crystal substrate 12 after forming the transistor 14 according to a second embodiment. FIGS. 4A-4C illustrate the heteroepitaxial STT-MRAM device 200 with the free magnetic layer 26 (particularly the active region 420) defined by the underlying SEG epitaxial stud 28.

FIG. 4A starts from FIG. 2D discussed above. As noted above, FIG. 4A shows the single-crystal substrate 12, which may be a silicon wafer in one case. Doping occurs to form the transistor 14 as understood by one skilled in the art. The dielectric layer 13 is disposed on the substrate 12. The dielectric layer 13 covers the surface of the substrate 12 including the transistor 14. Further, the dielectric layer 13 may include silicon dioxide and tetraethylorthosilicate (TEOS) which are materials that are high in oxygen molecules, in order to oxidize portions of the free magnetic layer 26 as discussed further herein. In one case, germanium dioxide and hafnium oxide may be utilized as the dielectric layer 13 if they contain sufficient oxygen to oxidize the dielectric layer 13. It should be noted that the dielectric layer 13 cannot be silicon nitride when the dielectric layer 13 is used to transfer (relinquish) oxygen to the dielectric layer 13 as discussed below.

As discussed above, the hole 205 can be formed through the dielectric layer 13 down to the single-crystal substrate 12 underneath. The hole 205 is formed directly over the source (S) terminal of the transistor 14 to have a depth corresponding to the thickness of the dielectric layer 13. In another case, the hole 205 may be formed directly over the drain (D) terminal instead of the source (S) terminal of the transistor 14. In FIG. 4A, the selective epitaxial growth (SEG) is performed in order to slightly overfill the hole 205 with single-crystal silicon 210 using the substrate wafer 12 as the seed. Accordingly, the single-crystal silicon 210 has a lattice match (e.g., matching lattice constant) to the single-crystal substrate 12 used as the seed. Annealing is performed to ensure that the silicon 210 has a single-crystal lattice structure that matches single-crystal substrate 12. In one case, the silicon 210 may be polycrystalline and the annealing orients lattice of the silicon 210 to match the single-crystal lattice (e.g., lattice constant) of the single-crystal substrate 12.

Note that transfer/orientation of the single-crystal lattice match 212 (from the single-crystal substrate 12 to the single-crystal silicon 210 via selective epitaxial growth (SEG)) is represented by the grid 212. To minimize parasitic resistance, the epitaxial stud 28 may be heavily N-type (N+) doped, assuming the epitaxial stud 28 is grown over the N-type part of transistor 14 in the substrate 12. If the terminal of the transistor 14 happens to be P-type, then the epitaxial stud 28 would be doped with P-type dopants.

As noted above, the structure is then planarized. The layers of the magnetic tunnel junction 20 are disposed on the planarized dielectric layer 13 and SEG epitaxial stud 28. The MTJ layers are deposited in a heteroepitaxial manner using the top of the SEG silicon stud 28 as the seed. First, an interface layer or layers 215 may be deposited, to accomplish one or more of the following: to act as a diffusion barrier, to create an ohmic contact, to enable lattice matching (between the SEG stud 28 and the layers above the interface layer 215), to promote perpendicular magnetic anisotropy, and/or to control stress. In FIG. 4A (unlike FIG. 2), the thickness (in the y-axis) of the interface layer 215 may be up to about 5 Angstroms (Å) which is ultra-thin. In one case, the thickness of the interface layer 215 may be 2 or 3 Å. The interface layer 215 may be nickel silicide, nickel cobalt silicide, etc. The interface layer 215 has the same single-crystal lattice match 212 as the SEG epitaxial stud 28 underneath, thus having the single-crystal lattice match 212 to the single-crystal substrate 12.

Next, the free magnetic layer 26 is deposited on the interface layer 215. In FIG. 4A, the free magnetic layer 26 is very thin. The free magnetic layer 26 may be up to 14 or 16 Å thick. In one case, the free magnetic layer 26 may be about 2 to 16 Å.

The tunnel barrier layer 24 is deposited on the free magnetic layer 26. The reference magnetic layer 22 is deposited on the tunnel barrier layer 24.

A bit line layer 405 is disposed on the reference magnetic layer 22. Other than the bit line layer 405, this film stack (of layers 215, 26, 24, 22) is of a single-crystal nature above the silicon epitaxial stud 28, and not so elsewhere, with a boundary near the edge of the epitaxial stud 28. The single-crystal nature in the layer 215, 26, 24, 22 is represented by the single-crystal lattice match 212.

FIG. 4B illustrates that, during subsequent thermal processing, the dielectric 13 surrounding the epitaxial (contact) stud 28 provides a reactive agent (i.e., oxygen) which converts the overlying free magnetic layer 26 into an insulator 410, 415. The insulator (which was previously the free magnetic layer 26) is represented as left insulator 410 and right insulator 415 (directly) over the dielectric layer 13. FIG. 4B illustrates annealing to convert portions of the free magnetic layer 26 above the dielectric 13 into the insulator 410, 415 while portions above the silicon SEG stud 28 are not converted, and the also annealing defines the active area (active region 420 shown in FIG. 4C) of the MTJ 20. The active area of MTJ 20 is limited to the non-oxidized part of free layer 26.

FIG. 4C illustrates that the MTJ layers 20 are patterned and subtractively etched in a line space pattern corresponding to the bit lines 405 in the memory array (which is an array of bit lines 405 each having their respective MTJs 20 underneath as understood by one skilled in the art). The annealing process converts free magnetic layer 26 around the SEG into the nonconductive layer and separates consecutive MTJs along the bit line 405 in the z-direction; patterning the bit line 405 in the x-direction correspondingly patterns the separate individual magnetic tunnel junctions 20. It is understood that there are multiple magnetic tunnel junctions formed in the z-direction under the bit line 405.

The layers 215, 26, 24, 22 underneath the bit line layer 405 do not need to be independently patterned before patterning the bit line layer 405. In other words, the free magnetic layer 26, the tunnel barrier 24, and the reference magnetic layer 22 (that make up the MTJ 20) all remain unpatterned along with the interface layer 215, until the patterning begins for the bit line layer 405. The width of the patterned bit line layer 405 determines the width of the patterning of layers below. However, in a conventional MRAM device, the MTJ would have been patterned/etched to a very narrow width (which corresponds to a diameter), and this patterning/etching damages the sidewalls (in the active region) of the MTJ in a conventional MRAM.

Unlike a conventional MRAM, FIGS. 4A-4C illustrate etching/patterning the MTJ 20 while simultaneously etching the wider bit line 405, and the active region 420 is not damaged (or even affected) during the etching because the width of the patterned bit line layer 405 is wider than the diameter of the active region 420 of the MTJ 20. The diameter of the active region 420 (and the MTJ 20) is defined by being between the left and right insulator 410, 415 in the x-direction. For example, the free magnetic layer 26 positioned between the left and right insulator 410, 415 defines the width of the active region 420 for the MTJ 20, and the free magnetic layer 26 is over the SEG epitaxial stud 28. The active region 420 conducts electricity, has a perpendicular anisotropy, and provides the magnetoresistance for the MTJ 20. The active region 420 extends up from the free magnetic layer 26, through the tunnel barrier layer 24, through the reference magnetic layer 22, and stops at the top edge of the reference magnetic layer 22.

Assume that electrical current flows from the source (S) terminal into the SEG epitaxial stud 28. If the free magnetic layer 26 above the dielectric layer 13 were not converted into the insulator 410, 415, the current would flow left and right (x-direction) in the free magnetic layer 26 after leaving the epitaxial stud 28. However, since the left and right insulators 410, 415 are present, the electrical current 430 flows from the transistor 14, through the epitaxial stud 28, through the interface layer 215, through the free magnetic layer 26 (only in the active region 420), through the tunnel barrier layer 24, through the reference magnetic layer 22 (in the active region 420), and into the bit line 220. Note that the single-crystal lattice match 212 is not shown when the active region 420 is depicted, so as not to obscure the figure. It is understood that the single-crystal lattice match 212 is present.

To ensure that the dielectric layer 13 has sufficient oxygen to react with the free magnetic layer 26 positioned above the dielectric layer 13, the dielectric layer may be silicon dioxide or TEOS as noted above, and both the free magnetic layer 26 and interface layer 215 should be ultra-thin. Annealing is performed to convert the free magnetic layer 26 positioned above the dielectric layer 13 along with the interface layer 215 (above the dielectric layer 13) into the insulator 410, 415. Accordingly, the thickness (in the y-axis) of the interface layer 215 may be may be about 2 or 3 Å and/or up to about 5 Å. Similarly, the thickness of the free magnetic layer 26 may be up to 14 or 16 Å, and/or about 2 to 16 Å. The free magnetic layer 26 may be CoFeB to react with the oxygen above the dielectric layer 13. In one case, the free magnetic layer 26 may be pure Fe, CoFe alloys, and/or CoFeX alloys where X denotes metals or semiconductors which are conductive when alloyed with CoFe alloys. Usually, the concentration of X in the free magnetic layer 26 should be below a few percent (%) to preserve good magnetic properties of the free magnetic layer 26. One reason for adding material X to the free magnetic layer 26 is to achieve a better lattice match between the SEG layer 28 and tunnel barrier 24.

In one case, annealing may be performed at 360° C. for about 1 hour when the free magnetic layer 26 is about 16 Å, performed at 300° C. for about 1 hour when the free magnetic layer 26 is about 14 Å, and/or performed at 280° C. for about 1 hour when the free magnetic layer 26 is below 10 Å, in order to form the insulator 410, 415. The time and temperature of the annealing is based on the thickness of the free magnetic layer 26 to ensure that the entire thickness converts to the insulator 410, 415 (above the dielectric layer 13) and based on having oxygen available; the annealing cannot be so long as to destroy the active region 420 between the insulator 410, 415 and/or the amount of oxygen in the dielectric layer 13 (oxygen rich layer discussed below) cannot be so rich as to destroy the active region 420 between the insulator 410, 415. The device size (particularly active region 420) of the MTJ 20 is defined by the chemical reaction between the dielectric layer 13 and the free magnetic layer 26.

In one implementation, it is noted that the interface layer 215 is so thin that it does not form a continuous layer on top of the dielectric layer 13, but forms a continuous layer when grown on conductive substrates in/above SEG stud 28. It is understood by one skilled in the art that metals grow in islands on dielectrics and forms continuous layers on conductors. Depending of the materials used in interface layer 215, this layer 215 during the annealing may convert into oxide layer and be nonconductive like the insulator 410, 515 of the free magnetic layer 26. In another implementation, the interface layer 215 can be conductive, but since the interface layer 215 is ultra-thin its conductivity so small that its conductivity can be neglected.

The left and right non-active regions 460 and 462 extend from the active region 420 to the respective sides of the MTJ 20 in the x-direction. The sidewalls of left and right non-active regions 460 and 462 may become damaged during patterning of the bit line layer 220, but this etch damage usually is a few nanometers thick and does not reach active region 420.

The widths (in the x-direction) of the left non-active region 460, active region 420, and right non-active region 462 are each about one-third the total width of the MRAM device 400. For example, in one extreme case of a super dense MRAM, the widths of the left non-active region 460, active region 420, and right non-active region 462 may each be about 5 nm (typical edge damage width) for a total width of 15 nm. For the 22 nm CMOS technology case, the widths of the left non-active region 460 and right non-active region 462 may each be about 5 nm while the width of the active region 420 is 12 nm. It should be clear that the left and right insulators 410 and 415 also correspond to the non-active regions.

Figure 5:
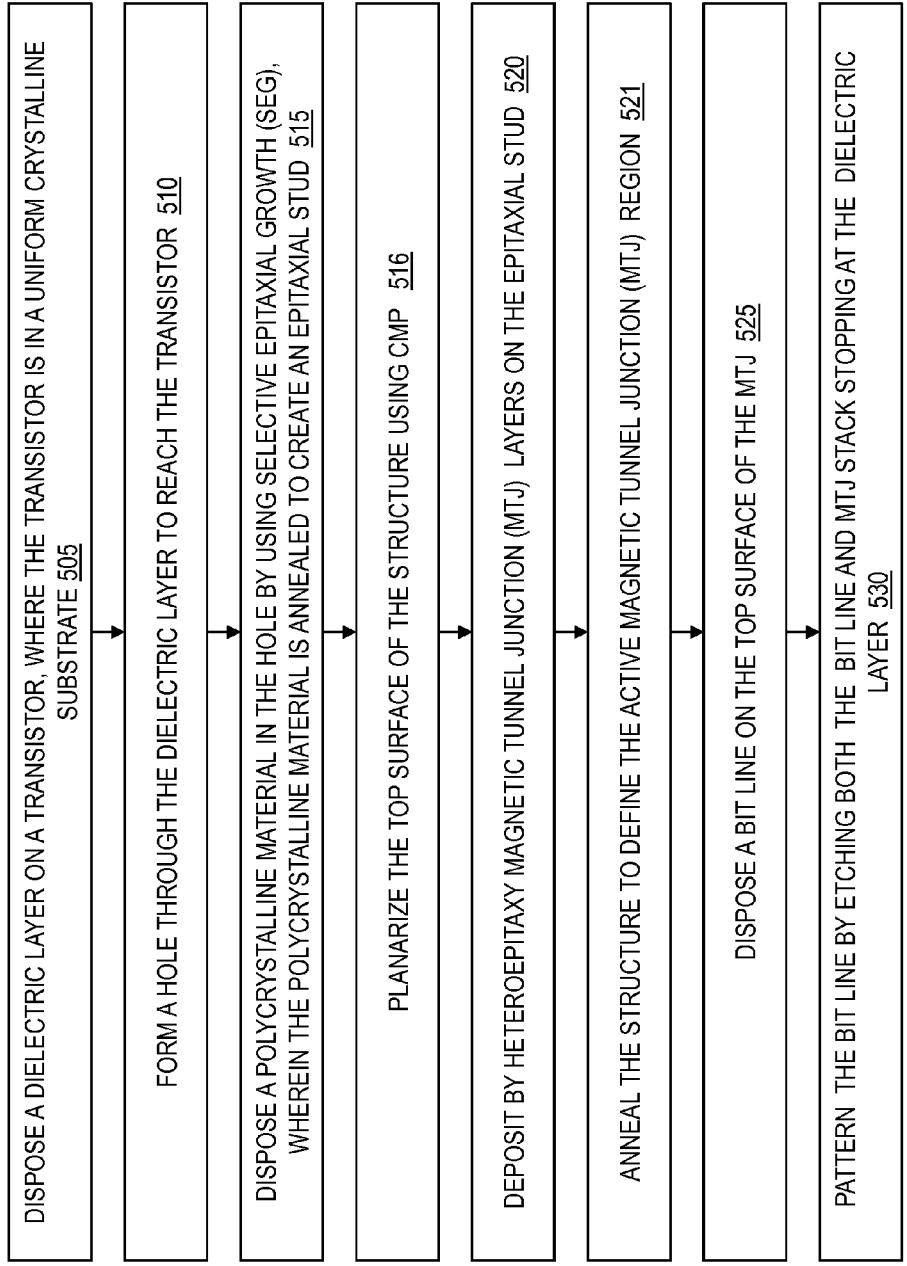
FIG. 5 illustrates a method of forming a magnetic random access memory (MRAM) device according to the second embodiment.

FIG. 5 is a method 500 of forming a magnetoresistive random access memory (MRAM) device according to a second embodiment. FIG. 5 refers to the STT MRAM device 400 in FIG. 4, and includes some features discussed in FIGS. 1-3 as understood by one skilled in the art.

At block 505, the dielectric layer 13 is disposed on the transistor 14, where the transistor 14 is formed in a uniform crystalline substrate 12. At block 510, the hole 205 is formed through the dielectric layer 13 to reach the transistor 14.

At block 515, the polycrystalline material (210) is disposed in the hole 205 by using selective epitaxial growth (SEG), where the polycrystalline material is annealed to create an epitaxial stud 28. At block 516, the top surface of the structure is planarized via CMP to form a smooth surface.

At block 520, the layers of the magnetic tunnel junction (MTJ) 20 are heteroepitaxially disposed on the epitaxial stud 28 (along with the dielectric layer 13), where the magnetic tunnel junction 20 is unpatterned and does not require separate patterning. At block 521, the structure is annealed to define the active magnetic tunnel junction region 420.

At block 525, the bit line layer 405 is disposed on the magnetic tunnel junction 20. The free magnetic layer 26 of the magnetic tunnel junction 20 is defined according to a width of the epitaxial stud 28 because the growth of the left and right insulator 410, 415 is designed to be over the dielectric layer 13 but not the epitaxial stud 28.

At block 530, the bit line 405 is patterned by etching both the bit line 405 and the layers underneath stopping at the dielectric layer 530. Although not shown a top dielectric layer can be deposited on top of the bit line 405 and a top contact can be deposited on the top dielectric such that the top contact is in electrically connection to the bit line 405.

Patterning the bit line 220 causes the magnetic tunnel junction 20 to be patterned to the bit line width (as shown in FIG. 4C), such that the MTJ 20 can be patterned simultaneously with the patterning for the bit line 220. The bit line width of the bit line 220 is wider (in the x-direction) than the active region 420 of the magnetic tunnel junction 20, thereby preventing damage to the active region 420 of the magnetic tunnel junction 20 when patterning the bit line 220. Defining the free magnetic layer 26 of the magnetic tunnel junction 20 according to the width of the epitaxial stud 28 comprises annealing the free magnetic layer 26 such that the free magnetic layer 26 above the dielectric layer 13 is converted to an insulator (left and right insulators 410 and 415 in FIGS. 4B and 4C). The free magnetic layer 26 above the epitaxial stud 28 forms part of an active region 420 in the magnetic tunnel junction 20 and is not converted to the insulator 410, 415. The insulator, having previously been portions of the free magnetic layer 26 above the dielectric layer 13, is on the right (415) and left (410) sides of the active region 420 of the free magnetic layer 26, which allows the active region 420 to be automatically defined in between. The active region 420 has perpendicular anisotropy, conducts electricity, and contributes to magnetic resistance of the magnetic tunnel junction 20.

Figure 6:
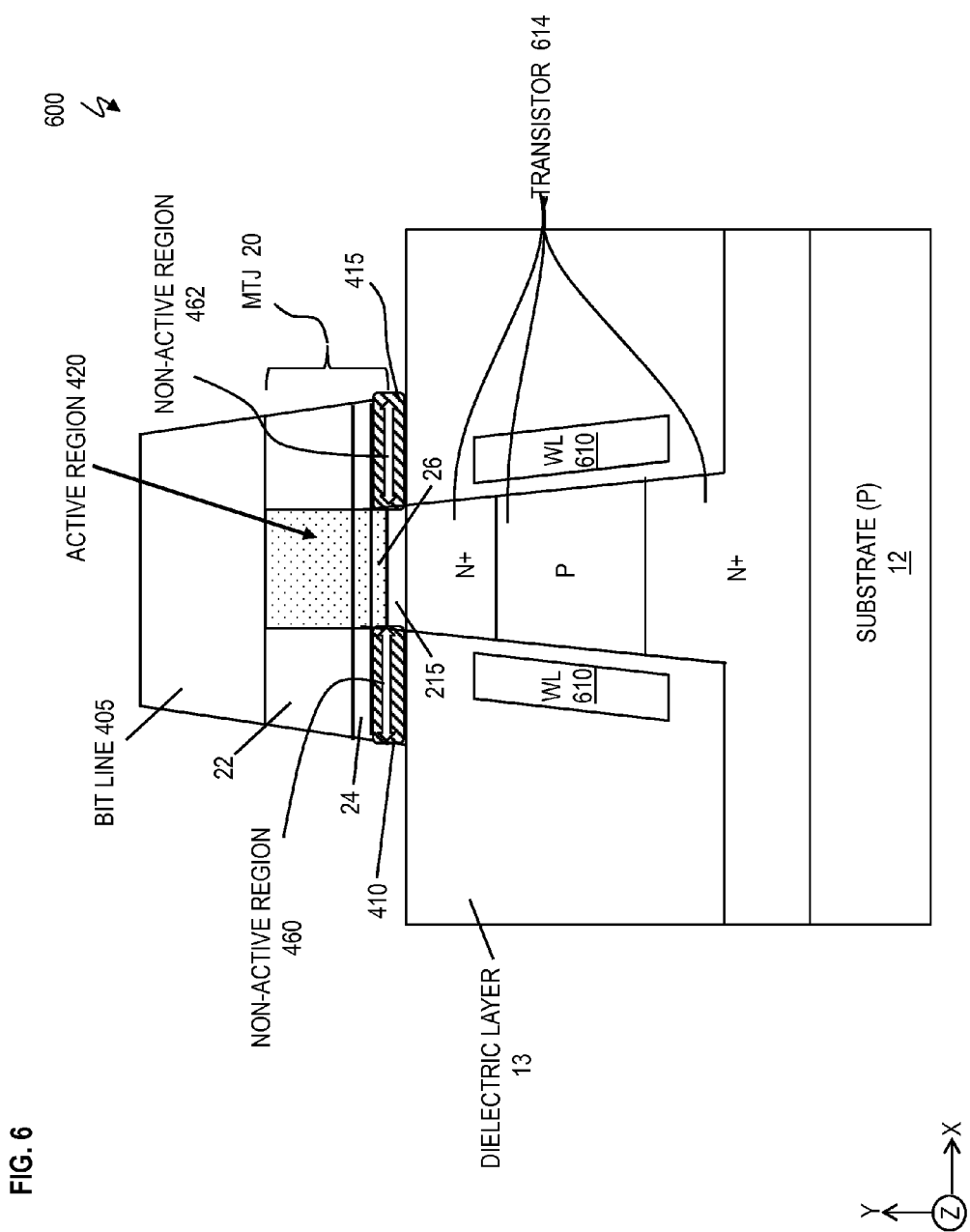
FIG. 6 illustrates a magnetic random access memory (MRAM) device located directly on the top of a vertical transistor according to a third embodiment.

FIG. 6 illustrates the replacement of the SEG epitaxial stud 28 by a vertical pillar FET 614 (vertical transistor) according to a third embodiment. The vertical pillar transistor 614 may be constructed by known means as understood by one skilled in the art, covered with dielectric layer 13, and planarized so as to expose the upper source or drain terminal (N+) of the vertical pillar transistor 614. The word lines (WL) 610 are formed so as to have a gap between the world line 610 and the transistor 614.

The MTJ layers 20 (along with the interface layer 215) are grown in the heteroepitaxial manner as described herein, using the top terminal (N+) of the transistor 614 as the seed. One benefit of this embodiment is that the MTJ 20 is self-aligned to the vertical pillar FET 614 based on growth of the MTJ layers on the top N+ terminal of the vertical pillar FET 614.

FIG. 6 shows that the magnetic random access memory (MRAM) device 600 is located directly on the top of vertical transistor 614. Like in the second embodiment of FIG. 4, the active MTJ region 420 is defined by the annealing process and MTJ 20 layers can be patterned in one etch process together with etching bit lines 405. This is the most cost effective and high density method of making MRAM. There are at least three benefits of this method:

1) Edges of magnetic layers are usually damaged by etch process but in this case the edges of pattern are far away from MTJ active region 420.

2) The reference magnetic layer 22 is not patterned. As a result, the reference magnetic layer 22 is much more stable and stray magnetic fields coming from (left and right) edges of the reference magnetic layer 22 are far away from active region 420. Therefore, free layer spin torque switching is more symmetric.

3) Finally, by adjusting the size of SEG stud 28 one can better match tunnel resistance to select transistor.

Figure 7:
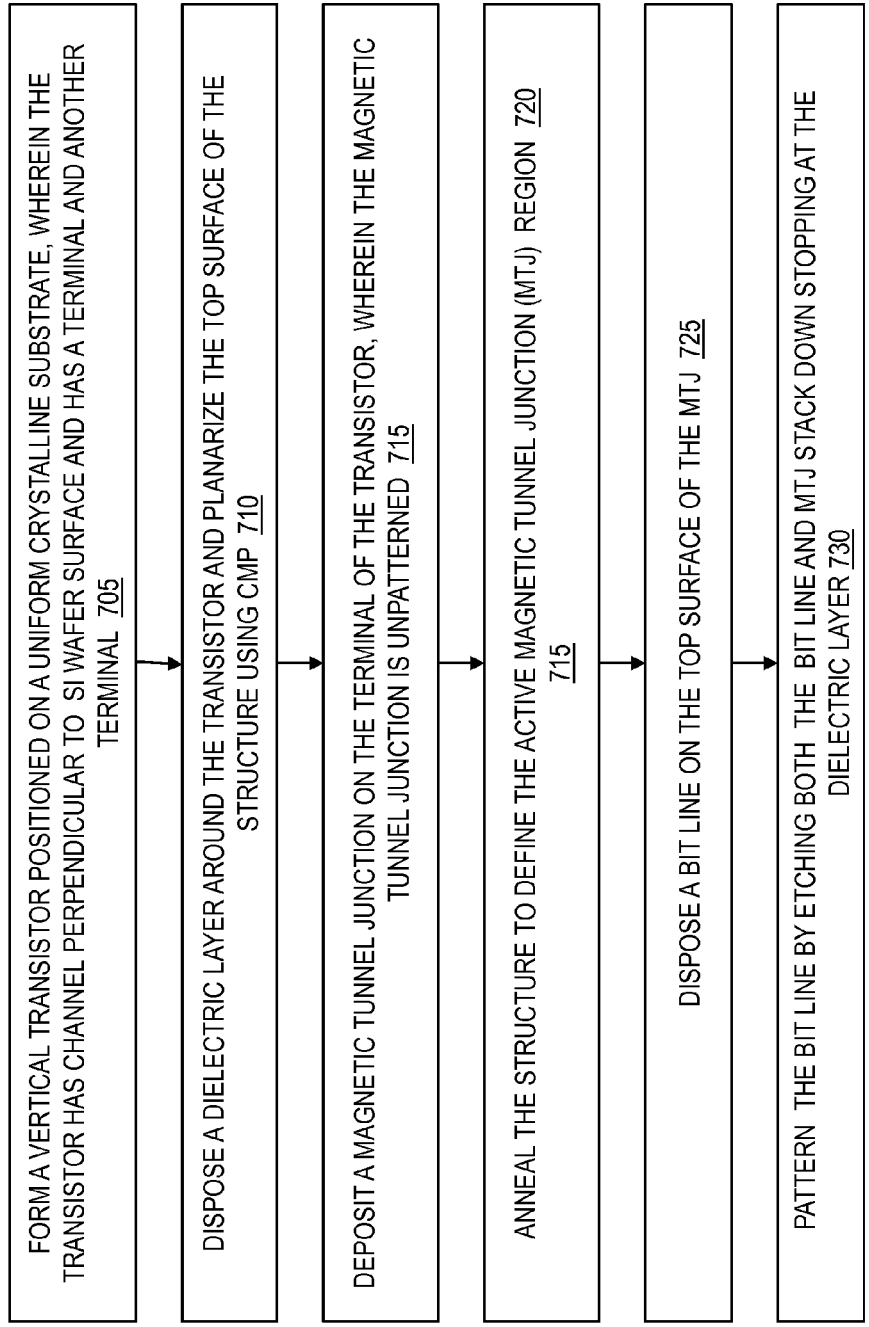
FIG. 7 illustrates a method of forming a magnetic random access memory (MRAM) device according to the third embodiment.

FIG. 7 is a method 700 of forming a magnetoresistive random access memory (MRAM) device according to the third embodiment. FIG. 7 refers to the STT MRAM device 600 in FIG. 6, and includes some features discussed in FIGS. 1-5 as understood by one skilled in the art.

At block 705, a transistor 14 is formed to be vertically positioned on the uniform crystalline substrate 12, where the transistor 14 has a terminal (e.g., N+ top terminal) and another terminal (N+ bottom terminal). At block 710, the dielectric layer 13 is disposed around the transistor 14 and the top surface of the structure is planarized using CMP.

At block 715, layers of the magnetic tunnel junction 20 are disposed on the terminal of the transistor 614 (along with dielectric 13), where the magnetic tunnel junction 20 is unpatterned (as discussed above). At block 720, the structure is annealed to define the active magnetic tunnel junction region 420.

At block 725, the bit line layer 405 is disposed on the magnetic tunnel junction 20. At block 730, the bit line 405 is patterned by etching both the bit line 405 and the layers underneath stopping at the dielectric layer 530. Although not shown a top dielectric layer can be deposited on top of the bit line 405 and a top contact can be deposited on the top dielectric such that the top contact is in electrically connection to the bit line 405.

The free magnetic layer 26 of the magnetic tunnel junction 20 is defined according to a width (in the x-direction) of the top (N+) terminal of the transistor 614 because the growth of the insulator 410, 415 is designed to be over the dielectric layer 13 but not the top N+ terminal of transistor 614.

Patterning the bit line 405 causes the magnetic tunnel junction 20 to be patterned to the bit line width (as shown in FIG. 4C), such that the MTJ 20 can be patterned simultaneously with the patterning for the bit line 405. The bit line width of the bit line 220 is wider (in the x-direction) than the active region 420 of the magnetic tunnel junction 420, thereby preventing damage to the active region 420 of the magnetic tunnel junction 20 when patterning the bit line 405. Defining the free magnetic layer 26 of the magnetic tunnel junction 20 according to the width (in the x-direction) of the top N+ terminal of transistor 614 comprises annealing the free magnetic layer 26 such that the free magnetic layer 26 above the dielectric layer 13 is converted to an insulator (left and right insulators 410 and 415 in FIG. 6). The free magnetic layer 26 above the top N+ terminal of transistor 614 forms part of an active region 420 in the magnetic tunnel junction 20 and is not converted to the insulator 410, 415. The insulator, having previously been portions of the free magnetic layer 26 above the dielectric layer 13, is on the right (415) and left (410) sides of the active region 420 of the free magnetic layer 26, which allows the active region 420 to be automatically defined in between. The active region 420 has perpendicular anisotropy, conducts electricity, and contributes to magnetic resistance of the magnetic tunnel junction 20.

Figure 8:
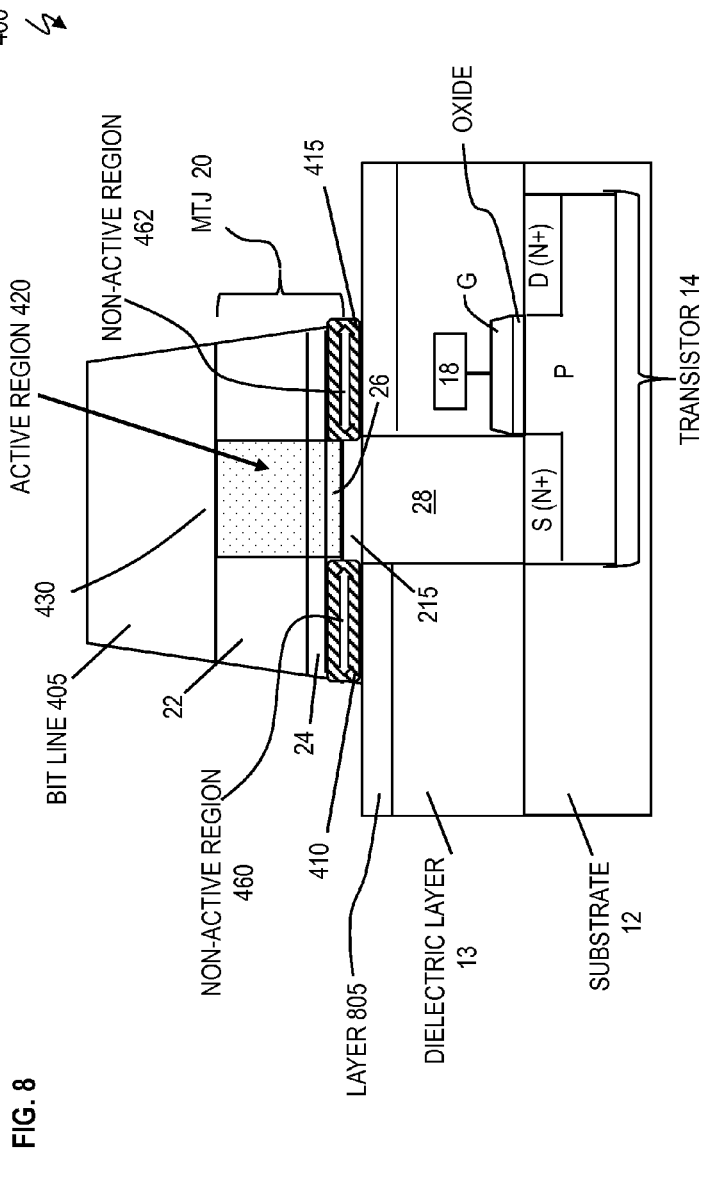
FIG. 8 illustrates a magnetic random access memory device with an additional layer as a source of oxidizing agent according to a fourth embodiment.

FIG. 8 illustrates a magnetic random access memory device with an additional layer as a source of oxidizing agent according to a fourth embodiment, in which a special layer 805 is deposited on top of the dielectric layer 13 (or the dielectric layer 13 is altered during CMP process). Layer 805 is a source of oxidizing agent which controls the free layer oxidation process.

FIG. 8 includes the features noted above in FIG. 4. FIG. 8 includes the transistor 14, the SEG stud 28, the MTJ 20, etc., as discussed in FIG. 4. However, in FIG. 8, the layer 805 acts as the source of the reactive agent (i.e., oxygen) as opposed to the underlying dielectric layer 13. In FIG. 8, any dielectric materials may be utilized as the dielectric layer 13 including silicon nitride because the dielectric layer 13 is not responsible for supplying the oxygen needed to convert the free magnetic layer 26 (above the layer 805) into the insulator 410, 415. The layer 805 may be any oxygen rich material (e.g., dielectric material), such as silicon dioxide, that is suitable for supplying oxygen and not conducting electricity. Other than the addition of the layer 805, FIG. 8 follows the description discussed in FIGS. 4A-4C and 5. It is contemplated that the technique in FIG. 8 can be applied to the vertical pillar FET embodiment in FIG. 6.

Figure 9:
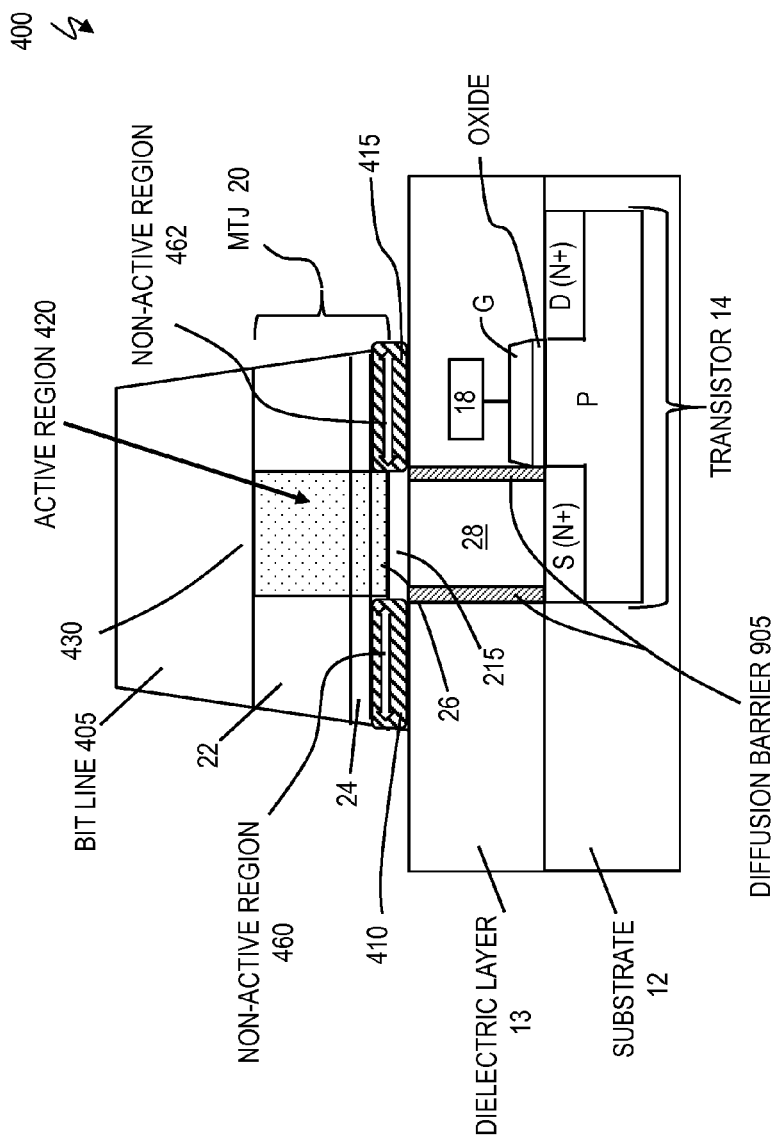
FIG. 9 illustrates a magnetic random access memory (MRAM) device with a diffusion barrier according to fifth embodiment.

FIG. 9 illustrates the addition of a vertical diffusion barrier 905 on both sides of the SEG stud 28 according to a fifth embodiment. The diffusion barrier 905 limits diffusion of the reactive agent (oxygen) from dielectric layer 13, through the SEG stud 28, and into the free magnetic layer 26 during annealing. This diffusion barrier 905 stops oxygen penetration from region 410, 415 into region 26 and allows a more precise definition of the MTJ active area 420. This technique can similarly be applied to the vertical pillar FET embodiment and the layer 805 embodiment.

Note various semiconductor device fabrication methods may be utilized to fabricate the STT MRAM device 100 as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

Figure 10:
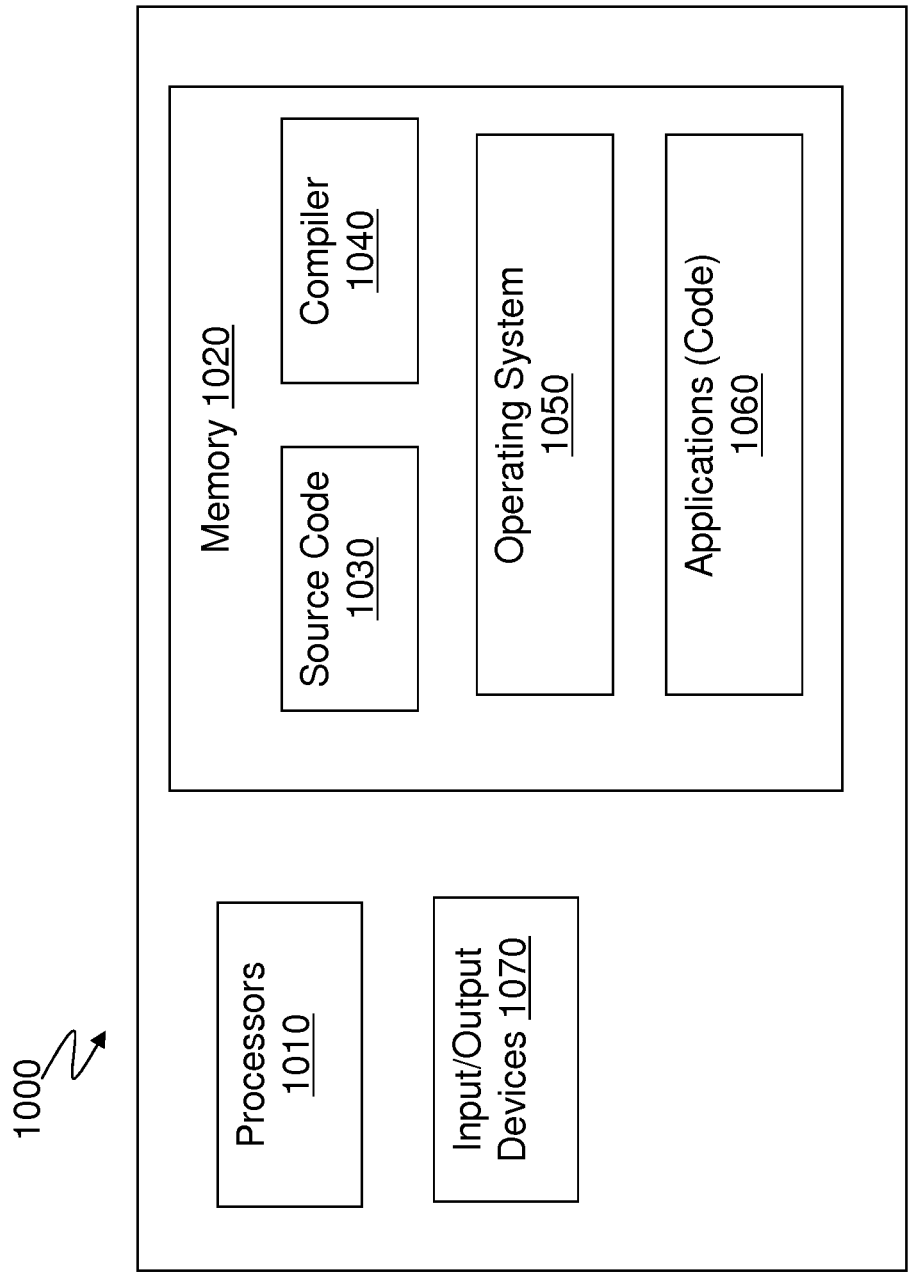
FIG. 10 illustrates an example computer that can implement and include features discussed herein according to an embodiment.

FIG. 10 illustrates an example computer 1000 that can implement features discussed herein. The computer 1000 may include a plurality of spin torque MRAM devices 100, 400, 600 connected in a grid to form addressable memory cells in a memory array. One skilled in the art understands how to connect spin torque MRAM devices in a memory array. The computer 1000 may be a distributed computer system over more than one computer. Various methods, procedures, modules, flow diagrams, tools, applications, circuits, elements, and techniques discussed herein may also incorporate and/or utilize the capabilities of the computer 1000. Indeed, capabilities of the computer 1000 may be utilized to implement and execute features of exemplary embodiments discussed herein.

Generally, in terms of hardware architecture, the computer 1000 may include one or more processors 1010, computer readable storage memory 1020 (which may include one or more MRAM devices 100, 400, 600), and one or more input and/or output (I/O) devices 1070 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 1010 is a hardware device for executing software that can be stored in the memory 1020.

The computer readable memory 1020 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Note that the memory 1020 can have a distributed architecture, where various components are situated remote from one another, but can be accessed by the processor(s) 1010.

The software in the computer readable memory 1020 may include one or more separate programs, each of which comprises an ordered listing of executable instructions for implementing logical functions. The software in the memory 1020 includes a suitable operating system (O/S) 1050, compiler 1040, source code 1030, and one or more applications 1060 of the exemplary embodiments.

The I/O devices 1070 may include input devices (or peripherals) such as, for example but not limited to, a mouse, keyboard, scanner, microphone, camera, etc. Furthermore, the I/O devices 1050 may also include output devices (or peripherals), for example but not limited to, a printer, display, etc. Finally, the I/O devices 1070 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 1070 also include components for communicating over various networks, such as the Internet or an intranet. The I/O devices 1070 may be connected to and/or communicate with the processor 1010 utilizing Bluetooth connections and cables (via, e.g., Universal Serial Bus (USB) ports, serial ports, parallel ports, FireWire, HDMI (High-Definition Multimedia Interface), etc.).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), astatic random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of forming a magnetoresistive random access memory (MRAM) device, the method comprising:
   disposing a dielectric layer on a transistor, wherein the transistor is formed in a uniform crystalline substrate;
   forming a hole through the dielectric layer to reach the transistor;
   disposing a polycrystalline material in the hole by using selective epitaxial growth (SEG), wherein the polycrystalline material is annealed to create an epitaxial stud;
   disposing a magnetic tunnel junction (MTJ) on the epitaxial stud, wherein the magnetic tunnel junction is unpatterned;
   disposing a bit line on the magnetic tunnel junction; and
   defining a free magnetic layer of the magnetic tunnel junction according to a width of the epitaxial stud.

2. The method of claim 1, wherein patterning the bit line causes the magnetic tunnel junction to be patterned to a bit line width.

3. The method of claim 2, wherein the bit line width of the bit line is wider than an active region of the magnetic tunnel junction, thereby preventing damage to the active region of the magnetic tunnel junction when patterning the bit line.

4. The method of claim 1, wherein defining the free magnetic layer of the magnetic tunnel junction according to the width of the epitaxial stud comprises annealing the free magnetic layer such that the free magnetic layer above the dielectric layer is converted to an insulator.

5. The method of claim 4, wherein the free magnetic layer above the epitaxial stud forms part of an active region in the magnetic tunnel junction and is not converted to the insulator; and wherein the insulator, having previously been portions of the free magnetic layer above the dielectric layer, is on right and left sides of the active region of the free magnetic layer.

6. The method of claim 5, wherein the active region has perpendicular anisotropy, conducts electricity, and contributes to magnetic resistance of the magnetic tunnel junction.

7. A method of forming a magnetoresistive random access memory (MRAM) device, the method comprising:

forming a transistor vertically positioned on a uniform crystalline substrate, wherein the transistor has a terminal and another terminal;

disposing a dielectric layer around the transistor;

disposing a magnetic tunnel junction on the terminal of the transistor, wherein the magnetic tunnel junction is unpatterned;

disposing a bit line on the magnetic tunnel junction; and defining a free magnetic layer of the magnetic tunnel junction according to a width of the terminal of the transistor.

8. The method of claim 7, wherein patterning the bit line causes the magnetic tunnel junction to be patterned to a bit line width.

9. The method of claim 8, wherein the bit line width of the bit line is wider than an active region of the magnetic tunnel junction, thereby preventing damage to the active region of the magnetic tunnel junction when patterning the bit line.

10. The method of claim 7, wherein defining the free magnetic layer of the magnetic tunnel junction according to the width of the terminal comprises annealing the free magnetic layer such that the free magnetic layer above the dielectric layer is converted to an insulator.

11. The method of claim 10, wherein the free magnetic layer above the terminal forms part of an active region in the magnetic tunnel junction and is not converted to the insulator;

wherein the insulator, having previously been portions of the free magnetic layer above the dielectric layer, is on right and left sides of the active region of the free magnetic layer; and wherein the active region has perpendicular anisotropy, conducts electricity, and contributes to magnetic resistance of the magnetic tunnel junction.

* * * * *